US011043280B1

United States Patent
Prakash et al.

(10) Patent No.: US 11,043,280 B1
(45) Date of Patent: Jun. 22, 2021

(54) REFRESH OPERATIONS FOR DEDICATED GROUPS OF BLOCKS OF MEMORY CELLS

(71) Applicant: SanDisk Technologies LLC, Addison, TX (US)

(72) Inventors: Abhijith Prakash, Milpitas, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/790,306

(22) Filed: Feb. 13, 2020

(51) Int. Cl.
| | |
|---|---|
| *G11C 16/04* | (2006.01) |
| *G11C 16/34* | (2006.01) |
| *G11C 11/56* | (2006.01) |
| *G11C 16/26* | (2006.01) |
| *G11C 16/08* | (2006.01) |
| *H01L 27/11582* | (2017.01) |
| *H01L 27/11556* | (2017.01) |

(52) U.S. Cl.
CPC ...... *G11C 16/3427* (2013.01); *G11C 11/5671* (2013.01); *G11C 16/0483* (2013.01); *G11C 16/08* (2013.01); *G11C 16/26* (2013.01); *H01L 27/11556* (2013.01); *H01L 27/11582* (2013.01)

(58) Field of Classification Search
CPC ............ G11C 16/3427; G11C 11/5671; G11C 16/0483; G11C 16/08; G11C 16/26
See application file for complete search history.

(56) References Cited

U.S. PATENT DOCUMENTS

| | | | |
|---|---|---|---|
| 7,489,540 B2 * | 2/2009 | Ramaraju | G11C 7/1045 |
| | | | 365/154 |
| 9,159,406 B2 | 10/2015 | Higashitani et al. | |
| 9,870,814 B2 * | 1/2018 | Emmot | G11C 11/4091 |
| 9,911,500 B2 | 3/2018 | Pang et al. | |
| 9,952,944 B1 | 4/2018 | Alrod et al. | |
| 10,109,354 B2 * | 10/2018 | Nagase | G11C 16/26 |
| 10,235,294 B1 | 3/2019 | Lu et al. | |
| 10,347,315 B2 | 7/2019 | Reusswig et al. | |

(Continued)

FOREIGN PATENT DOCUMENTS

EP 1403876 A1 3/2004

OTHER PUBLICATIONS

International Search Report & the Written Opinion of the International Searching Authority dated Aug. 13, 2020, International Application No. PCT/US2020/035021.

(Continued)

*Primary Examiner* — Pho M Luu
(74) *Attorney, Agent, or Firm* — Vierra Magen Marcus LLP

(57) ABSTRACT

Apparatuses and techniques are described for periodically refreshing word line voltages in a group of blocks in a memory device. In one aspect, each group of blocks stores the same number of bits per cell. For example, one group of blocks can be reserved for single level cell (SLC) data and another group of blocks can be reserved for multi-level cell (MLC) data. A common refresh voltage signal can be applied to the blocks in a group, where the voltage signal is optimized based on the number of bits per cell stored by the memory cells of the group. For an SLC block, the refresh voltage signal can decrease a floating voltage of the word lines. For an MLC block, the refresh voltage signal can increase a floating voltage of the word lines.

19 Claims, 19 Drawing Sheets

(56) References Cited

U.S. PATENT DOCUMENTS

| | | |
|---|---|---|
| 2009/0046510 A1 | 2/2009 | Song et al. |
| 2009/0310414 A1 | 12/2009 | Lee et al. |
| 2013/0051171 A1* | 2/2013 | Porter .................. G11C 5/147 |
| | | 365/222 |
| 2014/0063938 A1 | 3/2014 | Oh et al. |
| 2014/0334233 A1 | 11/2014 | Joo et al. |
| 2019/0362781 A1 | 11/2019 | Shibata et al. |

OTHER PUBLICATIONS

International Search Report & the Written Opinion of the International Searching Authority dated Aug. 12, 2020, International Application No. PCT/US2020/035022.
U.S. Appl. No. 16/415,457, filed May 17, 2019.
U.S. Appl. No. 16/704,817, filed Dec. 5, 2019.
U.S. Appl. No. 16/790,362, filed Feb. 13, 2020.

* cited by examiner

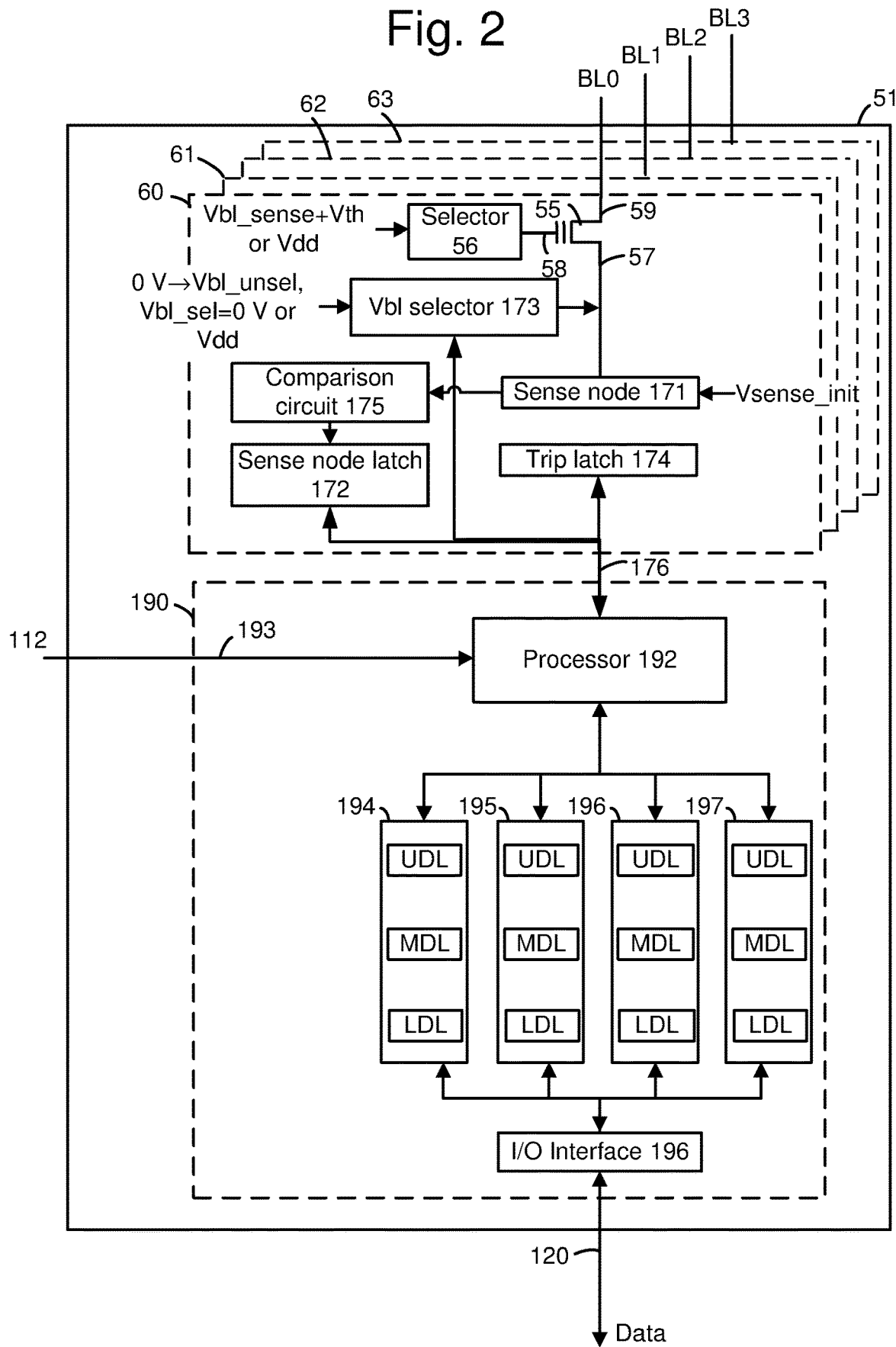

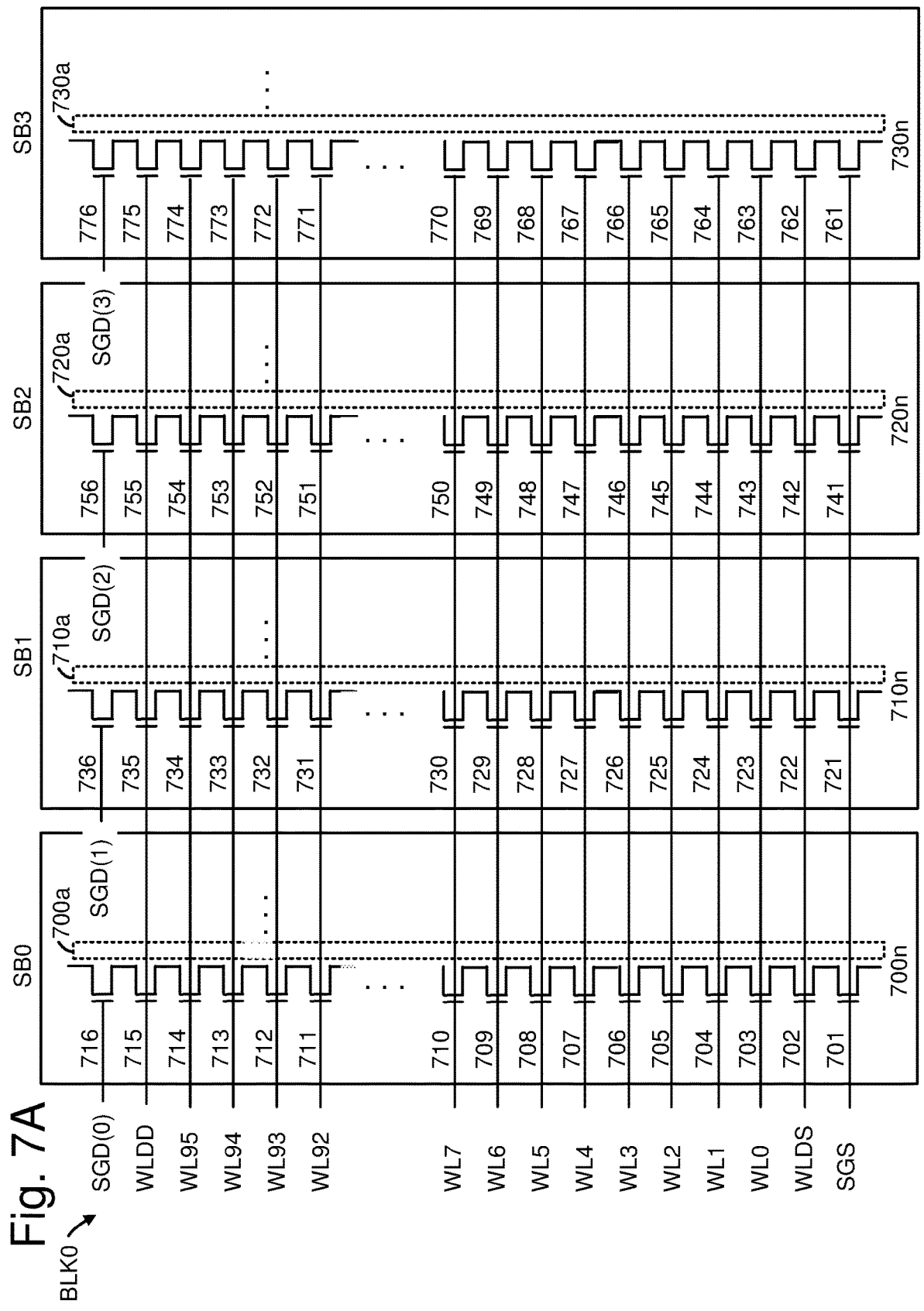

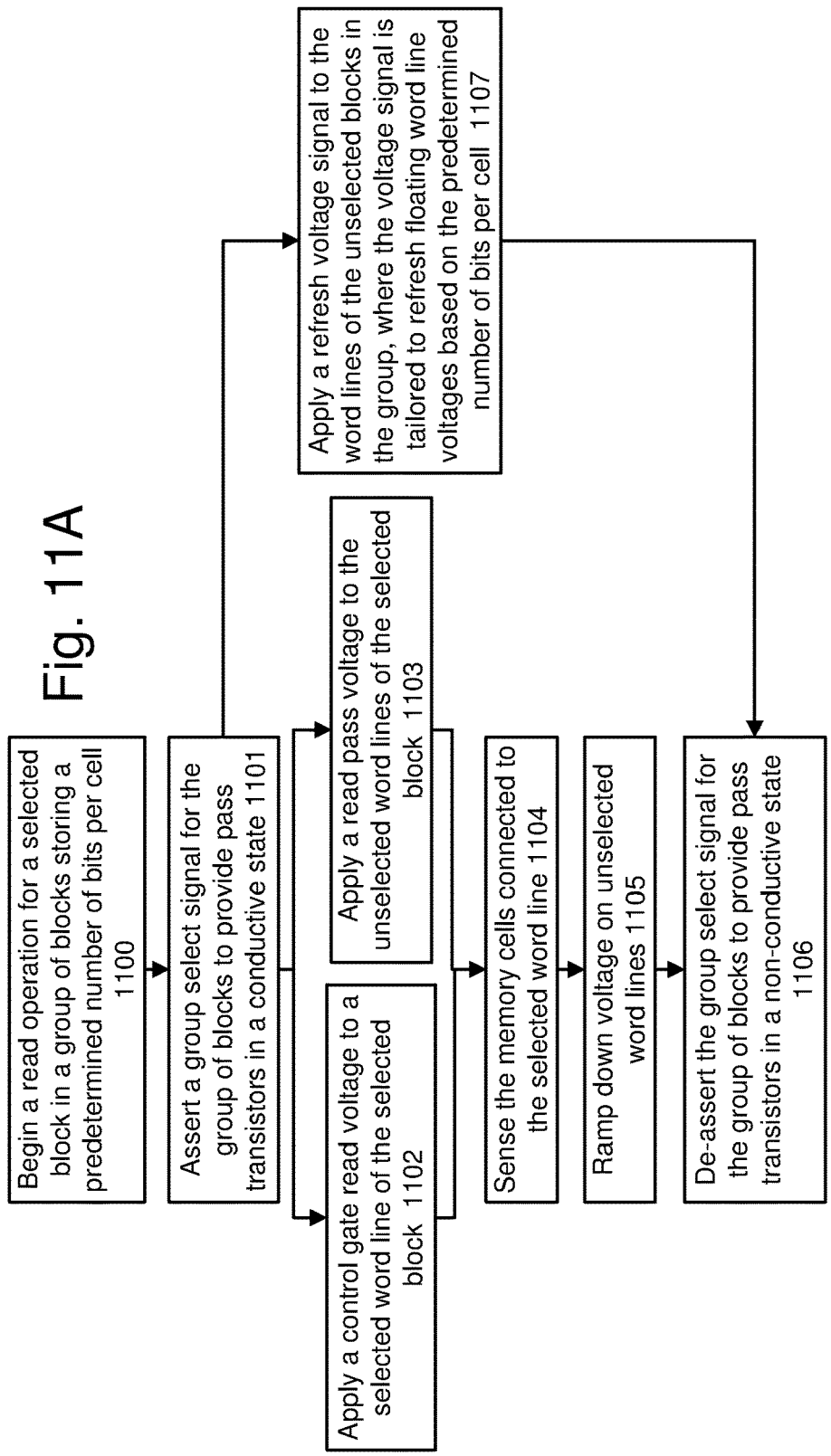

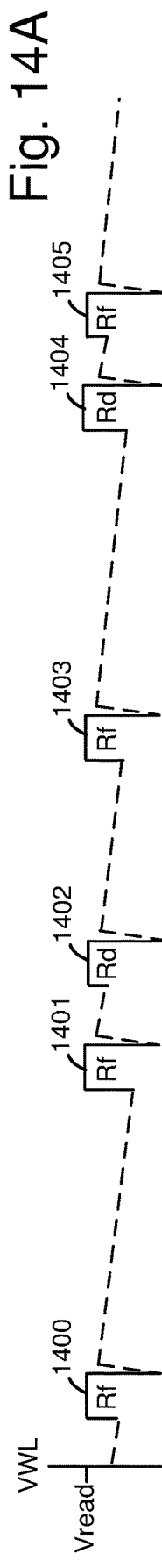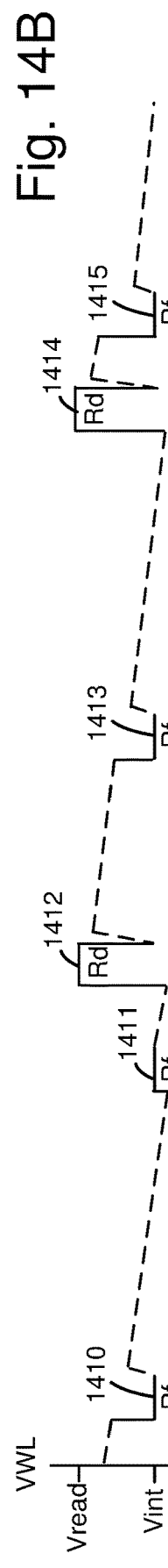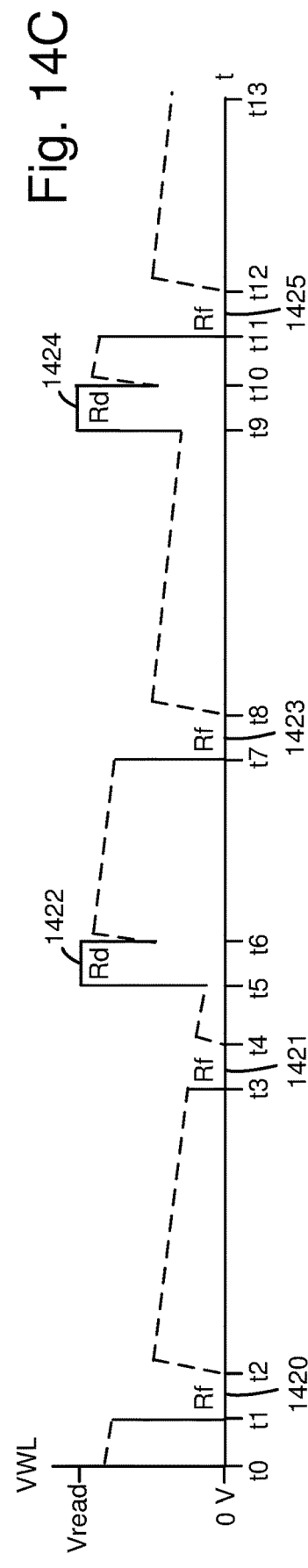

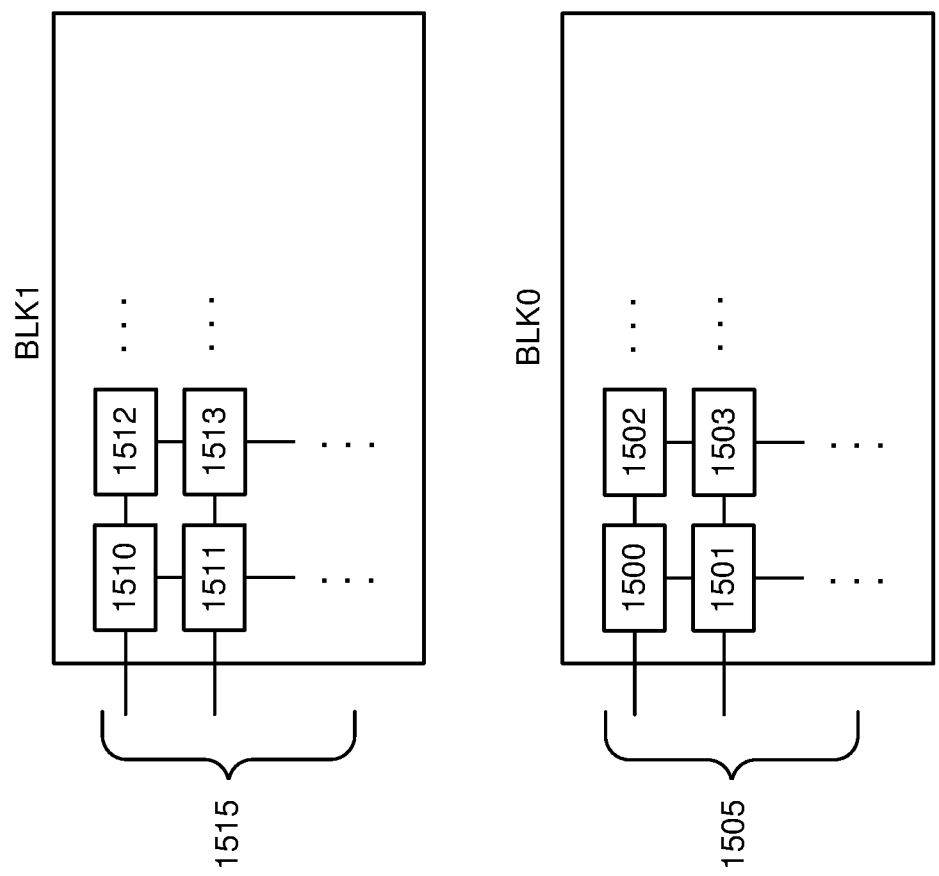

REFRESH OPERATIONS FOR DEDICATED GROUPS OF BLOCKS OF MEMORY CELLS

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in blocks, for instance. However, various challenges are presented in operating such memory devices.

BRIEF DESCRIPTION OF THE DRAWINGS

FIG. 2 is a block diagram depicting one embodiment of the sense block 51 of FIG. 1A.

FIG. 7A depicts an example view of NAND strings in a block BLK0 which is consistent with FIGS. 4 and 6.

FIG. 11A depicts a flowchart of an example process for refreshing word line voltages in a group of blocks.

FIG. 11B depicts an example table of the refresh voltage signal setting circuit 119 of FIG. 1A, for use in FIG. 11A, step 1107.

FIG. 14A depicts an example of word line voltages during read operations and refresh operations with a high amplitude refresh voltage, Vread.

FIG. 14B depicts an example of word line voltages during read operations and refresh operations with an intermediate amplitude refresh voltage, Vint.

FIG. 14C depicts an example of word line voltages during read operations and refresh operations with a low amplitude refresh voltage, Vss.

FIG. 15 depicts an example of a selected block BLK0 and an unselected block BLK1 in a group of blocks GRP0, consistent with FIG. 3A.

DETAILED DESCRIPTION

Apparatuses and techniques are described for periodically refreshing word line voltages in a group of blocks in a memory device.

Figure 4:
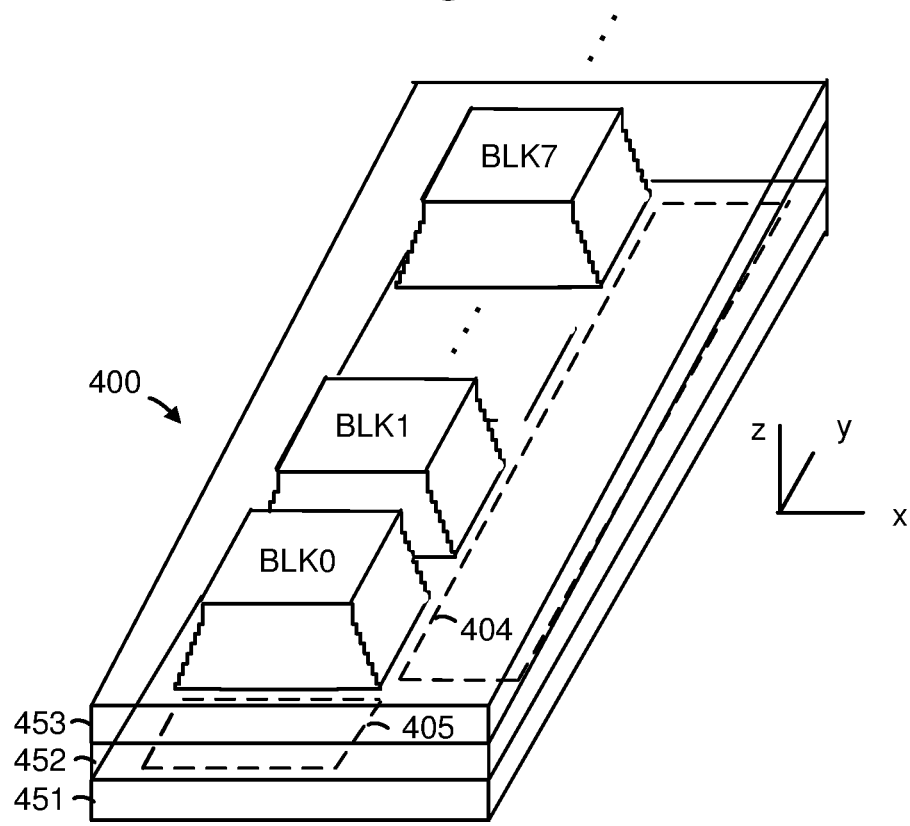
FIG. 4 is a perspective view of a memory device 400 comprising the blocks BLK0-BLK7 of FIG. 3A in an example 3D configuration.

In a memory device, memory cells can be arranged in a sequence of blocks such as depicted in FIG. 4. The memory cells can be joined to one another, e.g., in NAND strings, such as depicted in FIG. 7A. Further, the memory cells can be arranged in a 2D or 3D structure. In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate. The memory cells in a block can be subject to program, read and erase operations.

Each memory cell may be associated with a data state according to write data in a program command Based on its data state, a memory cell will either remain in the erased state or be programmed to a programmed data state. For example, in a one bit per cell block, there are two data states including the erased state and the programmed state. See FIG. 8A. In a two-bit per cell block, there are four data states including the erased state and three higher data states referred to as the A, B and C data states. See FIG. 8B. In a three-bit per cell block, there are eight data states including the erased state and seven higher data states referred to as the A, B, C, D, E, F and G data states. See FIG. 8C. In a four-bit per cell block, there are sixteen data states including the erased state and fifteen higher data states. A block with a single bit per cell is referred to as a single-level cell (SLC) block while a block with multiple bits per cell is referred to as a multi-level cell (MLC) block.

After the memory cells are programmed, the data can be read back in a read operation. A read operation can involve applying a series of read voltages to a selected word line while sensing circuitry determines whether cells connected to the selected word line are in a conductive (turned on) or non-conductive (turned off) state. If a cell is in a non-conductive state, the Vth of the memory cell exceeds the read voltage. The read voltages are set at levels which are expected to be between the threshold voltages of adjacent data states. During the read operation, a read pass voltage (Vread) such as 8-9 V is applied to the unselected word lines to provide the associated memory cells in a strongly conductive state.

However, the Vth of the memory cells can vary based on changes in the word line voltage when the memory cells are idle, between program or read operations. In particular, word line voltages can be coupled up from the channels of the NAND strings. In one possible coupling up mechanism, a pass voltage is applied to unselected word lines during a sensing operation, such as a read operation or a verify test of a program operation, and subsequently ramped down to 0 V, for instance. The ramp down causes a down coupling in the channel voltage. See, e.g., plot 1231 in FIG. 12A and plot 1271 in FIG. 12B. The down coupling subsequently dissipates and the channel voltage increases to a nominal level, close to 0 V, while the word line voltage is floated. See, e.g., plot 1232 in FIG. 12A and plot 1272 in FIG. 12B. This results in a coupling up of the word line voltage to a positive voltage such as about 4-5 V. See, e.g., plot 1204 in FIG. 12A and plot 1244 in FIG. 12B. The positive word line voltage is desirable as it tends to keep the Vth of the memory cells at a stable level. Although, over time, such as several minutes, the word line voltage discharges, resulting in a shift in the Vth of the memory cells. See FIG. 8A-8C.

When the word line voltages of a block are discharged, the block is in a first read or cold read state. This can occur when a memory device is powered on, or when the coupled up word line voltage has discharged after a sensing operation. When the word line voltages of a block are coupled up, the block is in a second read or warm read state. This can occur just after a sensing operation has been performed.

A refresh operation can be performed periodically to maintain the positive word line voltage during the idle time. The refresh operation can involve applying a refresh voltage signal to the word lines at the pass voltage level, and subsequently floating the word line voltages.

However, a type of disturb referred to as delayed read disturb (DRD) can increase the upper tail Vth of the erased state memory cells, as depicted in FIGS. 8A-8C, 9A and 10A-10D, potentially resulting in uncorrectable read errors. This disturb is caused by the coupled up word line voltages providing a weak programming of the erased state memory cells. DRD is a function of various factors such as the number of read operations, the time period between successive read operations, the number of program-erase (P-E) cycles and the operating temperature of the memory device. DRD is especially worse for heavily cycled blocks and is accelerated at higher temperatures. DRD is also worse for SLC blocks than for MLC blocks.

Techniques provided herein address the above and other issues. In one aspect, each group of blocks stores the same number of bits per cell. For example, one group of blocks is reserved for SLC data and another group of blocks is reserved for MLC data. In another example, one group of blocks is reserved for three bits per cell and another group of blocks is reserved for four bits per cell.

A group of blocks refers to blocks which are related in that they are selectable concurrently by a common group select signal. See, e.g., FIGS. 3A, 3D and 3F. Groups of blocks are configured in this way to provide a more efficient layout on the memory device. A common refresh voltage signal can be applied to the blocks in a group which is optimized based on the number of bits per cell stored by the memory cells of the group. For example, the amplitude of a refresh voltage signal for an SLC block can be lower than for an MLC block. For an SLC block, the refresh voltage signal can decrease a floating voltage of the word lines. For an MLC block, the refresh voltage signal can increase a floating voltage of the word lines. As another example, the duration of a refresh voltage signal for an SLC block can be longer than for an MLC block.

The optimization can also be based on the temperature and the number of P-E cycles. For example, the amplitude can also be lower when the number of P-E cycles is higher. See FIG. 11B. The amplitude can range from a high voltage such as a read pass voltage to an intermediate voltage and to 0 V or even a negative voltage. See FIG. 13.

In one possible scenario, one block in a group is selected for a read operation while the remaining blocks in the group are unselected and receive a refresh voltage signal. In another possible scenario, each block in the group receives the refresh voltage signal. The refresh voltage signal can be applied periodically to a group of blocks.

These and other features are discussed further below.

Figure 1A:
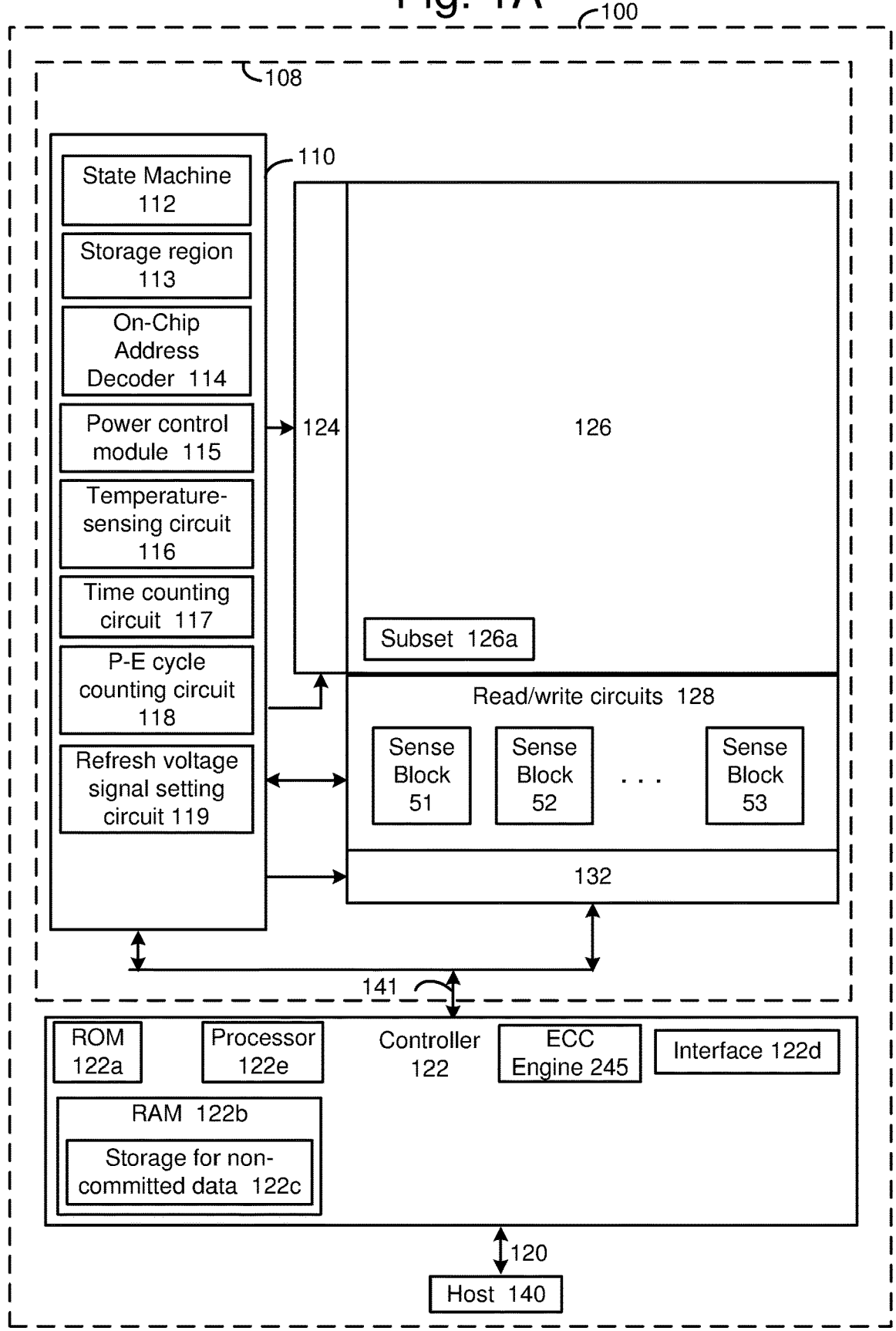
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a set of row decoders 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 141.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a time counting circuit 117, a P-E cycle counting circuit 118, and a refresh voltage signal setting circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3A-3F. The sense blocks can include bit line drivers, in one approach. The temperature-sensing circuit 116 can detect a temperature of the memory device on during the lifetime of the memory device, e.g., every minute. The time counting circuit 117 can count time and determine when an elapsed time has passed for initiating a refresh operation for a block as discussed herein. For example, see step 1107 in FIG. 11A.

The P-E cycle counting circuit 118 can track the number of program-erase (P-E) cycles of a block and classify the block into a category based on the number of P-E cycles. For example, the blocks can be classified into first, second and third categories which represent the beginning, middle and end of life, respectively, of a block. The classifications for the SLC blocks can be different than those for the MLC blocks since the SLC blocks typically can undergo more P-E cycles than MLC blocks in their lifetime. Also, the blocks can be periodically reclassified, and the number of blocks per group can change over time. In another example, the blocks are classified based on whether the number of P-E cycles is above or below a threshold. See, e.g., the threshold P-E_th1 and P-E_th2 in FIG. 11B.

The refresh voltage signal setting circuit 119 can set optimum characteristics of a refresh voltage signal for a group of blocks involved in a refresh operation based on the number of bits per cell stored in the blocks. The characteristics can include amplitudes and timing. See, e.g., FIG. 13. The circuit 119 can also use information from the circuits 116-118 to set an optimum refresh voltage amplitude. For example, the circuit 119 can evaluate the number of P-E cycles for a block by comparing the number of P-E cycles to a threshold such as P-E_th1 for SLC blocks and P-E_th2 for MLC blocks. See FIG. 11B. The circuit 119 can also consider the temperature from the temperature-sensing circuit 116.

Figure 1B:
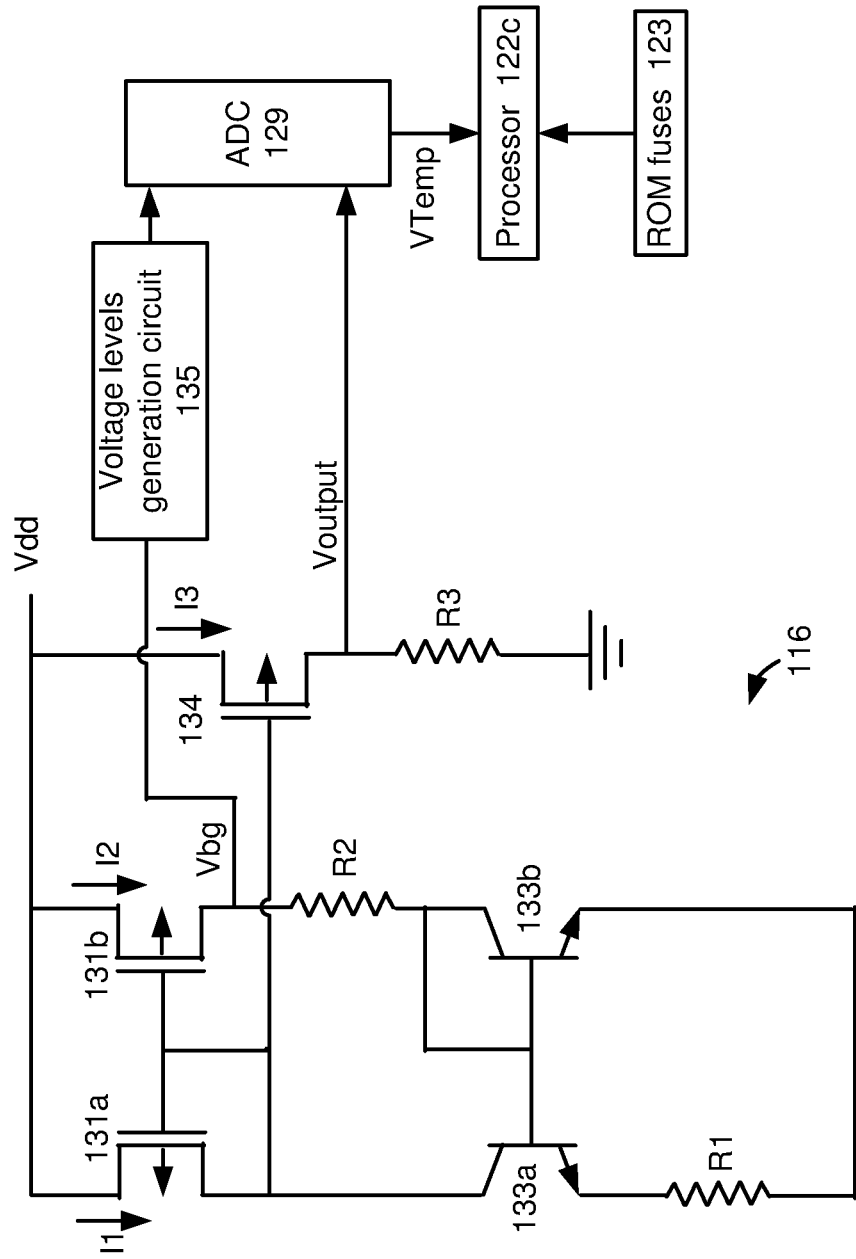
FIG. 1B depicts an example of the temperature-sensing circuit 116 of FIG. 1A.

See FIG. 1B for an example implementation of the temperature-sensing circuit. The circuits 116-119 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, time counting circuit 117, P-E cycle counting circuit 118, refresh voltage signal setting circuit 119, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122*e*. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one or a number of voltage signals. For example, the Vbl selector can pass a program-inhibit voltage signal which increases from an initial voltage, e.g., 0 V, to a program inhibit voltage, e.g., Vb1_inh for respective bit lines of unselected NAND string during a program loop. The Vb1 selector 173 can pass a program-enable voltage signal such as 0 V for respective bit lines of selected NAND strings during a program loop. The Vb1 selector may select a voltage signal from the BL voltage driver 340 in FIG. 3A based on commands from the processor 192, for example.

In one approach, the selector 56 of each sense circuit can be controlled separately from the selectors of other sense circuits. The Vb1 selector 173 of each sense circuit can also be controlled separately from the Vb1 selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of program pulses to the control gates of the addressed memory cells. Each program pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
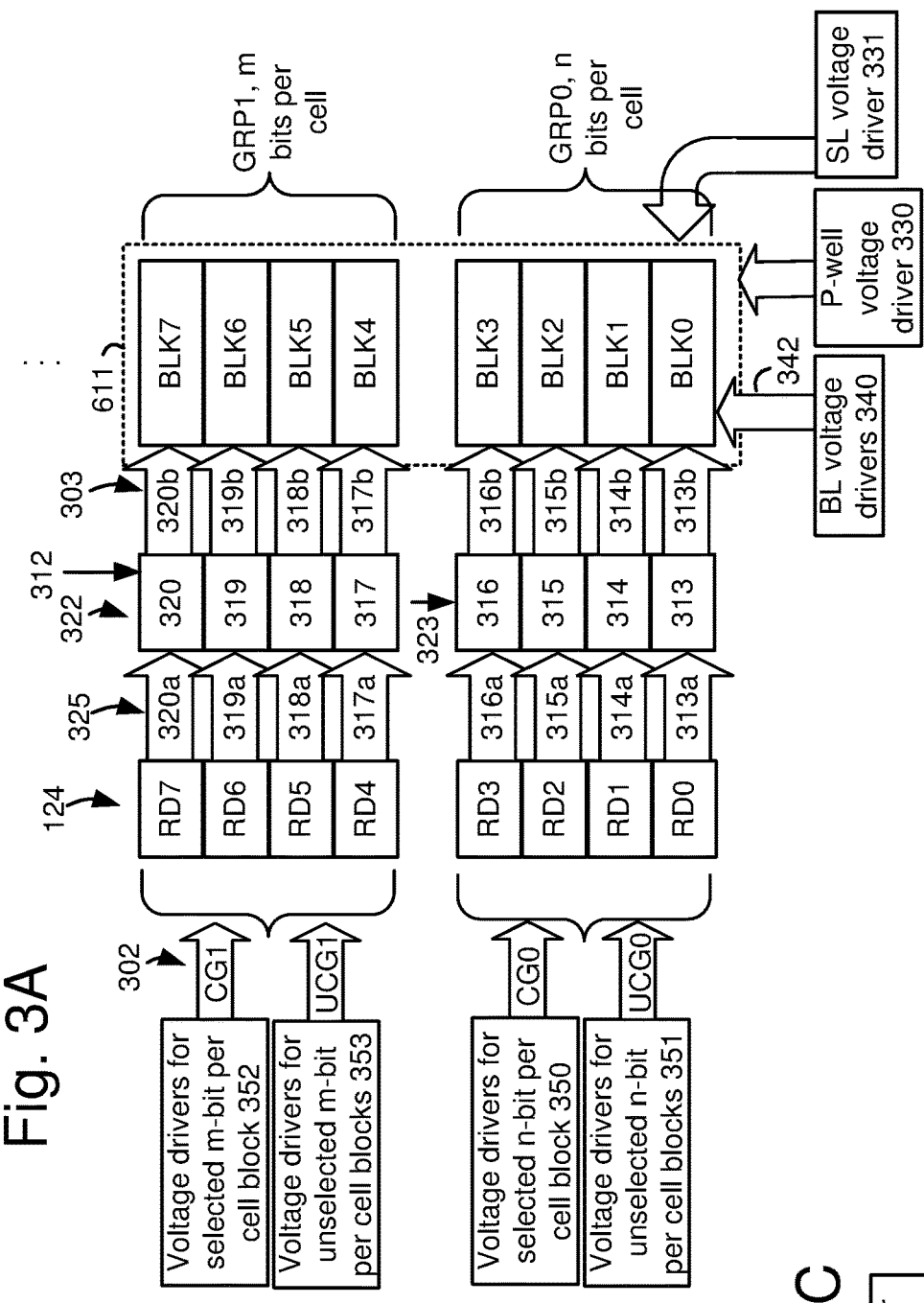
FIG. 3A depicts an example implementation of the power control circuit 115 of FIG. 1A for providing voltages to blocks of memory cells, where separate voltage drivers are provided for n-bit per cell and m-bit per cell groups of blocks.

FIG. 3A depicts an example implementation of the power control circuit 115 of FIG. 1A for providing voltages to blocks of memory cells, where separate voltage drivers are provided for n-bit per cell and m-bit per cell groups of blocks. The circuitry shown can be repeated for each plane of a die, in one approach. In this example, the memory structure 126 includes a first group of blocks GRP0, including blocks BLK0 to BLK3, and a second group of blocks GRP1, including blocks BLK4 to BLK7. In one approach, the GRP0 blocks are reserved for storing n bits per cell and the GRP1 blocks are reserved for storing m>n bits per cell. For example, GRP0 could have SLC cells (n=1) and GRP1 could have three-level MLC cells (m=3). In another example, GRP0 could have three-level MLC cells (n=3) and GRP1 could have four-level MLC cells (m=4). n and m are positive integer numbers. Two groups of blocks are depicted for simplicity, but in practice, there can be many more groups of blocks in a memory device. The blocks can be in one or more planes.

The set of row decoders 124 of FIG. 1A includes row decoders which are configured to provide voltages to word lines and select gate control lines of each block via pass transistors 322 (switches). The set of row decoders can include a respective row decoder for each block. For example, row decoders RD0-RD3 are provided for blocks BLK0-BLK3, respectively in GRP0, and row decoders RD4-RD7 are provided for blocks BLK4-BLK6, respectively in GRP1. Each row decoder can provide voltage signals on pre-switch control lines 325, which are before the pass transistors, e.g., between the row decoder and the pass transistors. If a pass transistor is on, the signal is passed to a respective word line, for example, which is after the switch, e.g., as a post-switch control line 303.

For example, in GRP0, BLK0 has pre-switch control lines 313a before the pass transistors 313, and post-switch control lines 313b after the pass transistors 313. BLK1 has pre-switch control lines 314a before the pass transistors 314, and post-switch control lines 314b after the pass transistors 314. BLK2 has pre-switch control lines 315a before the pass transistors 315, and post-switch control lines 315b after the pass transistors 315. BLK3 has pre-switch control lines 316a before the pass transistors 316, and post-switch control lines 316b after the pass transistors 314.

In GRP1, BLK4 has pre-switch control lines 317a before the pass transistors 317, and post-switch control lines 317b after the pass transistors 317. BLK5 has pre-switch control lines 318a before the pass transistors 318, and post-switch control lines 318b after the pass transistors 318. BLK6 has pre-switch control lines 319a before the pass transistors 319, and post-switch control lines 319b after the pass transistors 319. BLK7 has pre-switch control lines 320a before the pass transistors 320, and post-switch control lines 320b after the pass transistors 320.

A control circuit can provide a group select signal to the pass transistors which connect the blocks to the respective row decoders. In one approach, the group select signal is connected to control gates of the pass transistors of the group of blocks. One group of blocks can be selected at a time by asserting the respective group select signal to provide the pass transistors in a conductive state. The pass transistors for a group of blocks are either all on or off at a given time. If the pass transistors are on (conductive), voltages from the row decoders for the group of blocks are provided to the respective word lines of the group of blocks. If the pass transistors are off (non-conductive), the respective row decoders of the group of blocks are disconnected from the respective word lines so that the voltages float on the respective word lines.

For instance, a first group select signal for GRP0 can be provided on a first group select line 323, which in turn is connected to the sets of pass transistors 313-316, e.g., switches, which in turn are connected to word lines and select gate lines of BLK0-BLK3, respectively. Similarly, a second group select signal for GRP1 can be provided on a second group select line 312, which in turn is connected to the sets of pass transistors 317-320, which in turn are connected to word lines and select gate lines of BLK4-BLK7, respectively.

The row decoders can connect voltage signals on global control lines 302 to the pre-switch control lines for each block and ultimately to the post-switch control lines such as word lines. Voltages are provided on the global control lines from a number of voltage drivers, such as the drivers 350-353.

In an example implementation, separate voltage drivers are provided for the n-bit per cell and m-bit per cell groups. Additionally, within each group, separate voltage drivers are provided for selected and unselected blocks. For example, in GRP0, voltage drivers 350 are provided for a selected n-bit per cell block and voltage drivers 351 are provided for unselected n-bit per cell blocks. The voltage signals provided by the voltage drivers 350 are referred to as CG0, to denote selected control gates of memory cells of GRP0. The voltage signal provided by the voltage drivers 351 are referred to as UCG0, to denote unselected control gates of memory cells of GRP0.

Similarly, in GRP1, voltage drivers 352 are provided for a selected m-bit per cell block and voltage drivers 353 are provided for unselected m-bit per cell blocks. The voltage signals provided by the voltage drivers 352 are referred to as CG1, to denote selected control gates of memory cells of GRP1. The voltage signals provided by the voltage drivers 353 are referred to as UCG1, to denote unselected control gates of memory cells of GRP1. See FIG. 3B for example voltage drivers in the voltage drivers 350 and 352 for selected blocks, and FIG. 3C for example voltage drivers in the voltage drivers 351 and 353 for unselected blocks.

In some cases, there can be a delay in changing the word line voltage based on a change in a voltage on the global control lines 302 and the pre-switch control lines 325 due to the capacitance of the word lines. If the pass transistors are cutoff too soon, as may be required to meet timing requirements in some cases, the word line voltages may not reach the voltage on the global control lines 302 and the pre-switch control lines 325. For example, see plots 1243 and 1243a in FIG. 12B.

The various components, including the row decoders, may receive commands from a controller such as the state machine 112 or the controller 122 to perform the functions described herein. Each read decoder can be configured to route an appropriate refresh voltage signal to the word lines of the respective blocks. In one approach, one group of blocks at a time receive a refresh voltage signal. In another approach, multiple groups of blocks with the same number of bits per cell concurrently receive a common refresh voltage signal. In another approach, one or more groups of blocks with n bits per cell receive a first refresh voltage signal while one or more groups of blocks with m bits per cell receive a second refresh voltage signal.

The p-well voltage driver 330 provides a voltage Vp-well to the p+ contact 612b in the p-well region 611b, e.g., via the conductive path 682. See FIG. 6. In one approach, the p-well region 611b is common to the blocks. A set of bit lines 342 is also shared by the blocks. The source line (SL) voltage driver 331 provides a voltage Vs1 to the n+ contact 612c in the p-well region 611b, e.g., via the local interconnect 651.

Bit line voltage drivers 340 include voltage sources which provide voltages to the bit lines 342, such as a program-inhibit voltage signal, a program-enable voltage signal, a pre-charge voltage signal, and a voltage for sensing. The program-inhibit voltage signal has a magnitude of 1-2 V, for example, to inhibit programming in a NAND string. The program-enable voltage signal has a magnitude of 0 V, for example, to allow programming to occur for a selected memory cell in a NAND string. The pre-charge voltage signal has a magnitude of 1-2 V, for example, to pre-charge a channel of a NAND string. The voltage for sensing can have a magnitude of 0.5 V, for example, to facilitate sensing for a selected memory cell in a NAND string during a read operation or a verify test.

Figure 3B:
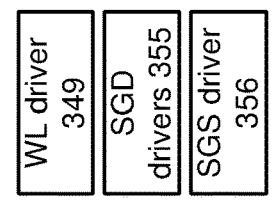
FIG. 3B depicts example voltage drivers for selected blocks consistent with the voltage drivers 350 and 352.

FIG. 3B depicts example voltage drivers for selected blocks consistent with the voltage drivers 350 and 352. The voltage drivers can include a selected word line (WL) driver 347, which provides a voltage on a word line selected during a program or read operation in a selected block in a group of blocks. The driver 347 can provide a pre-charge voltage and a program voltage on WLn during a program loop of a program operation. A driver 348 can provide a voltage on unselected word lines in the selected block. For example, the driver 348 can be used to apply a pre-charge voltage and a pass voltage on the unselected word lines during a program loop of a program operation.

The voltage drivers can also include SGD drivers 346 for selected and unselected sub-blocks. For example, the SGD drivers 346 can provide one voltage signal for a selected sub-block and another voltage signal for unselected sub-blocks. The SGD drivers provide a voltage to a control line connected to the control gates of an SGD transistor (drain-side select gate transistor).

The voltage drivers can also include an SGS driver 345 for a block. In one option, the SGS driver is common to the different sub-blocks in a block, and provides a voltage to a control line connected to the control gates of the SGS transistors (source-side select gate transistors).

Figure 3C:
FIG. 3C depicts example voltage drivers for unselected blocks consistent with the voltage drivers 351 and 353.

FIG. 3C depicts example voltage drivers for unselected blocks consistent with the voltage drivers 351 and 353. A WL driver 349 can be used to apply a refresh voltage signal to word lines of unselected blocks in a group of blocks. Also in the unselected blocks, the SGD drivers 355 provide a voltage signal to the SGD transistors and the SGS driver 356 provides a voltage signal to the SGS transistors.

Figure 3D:
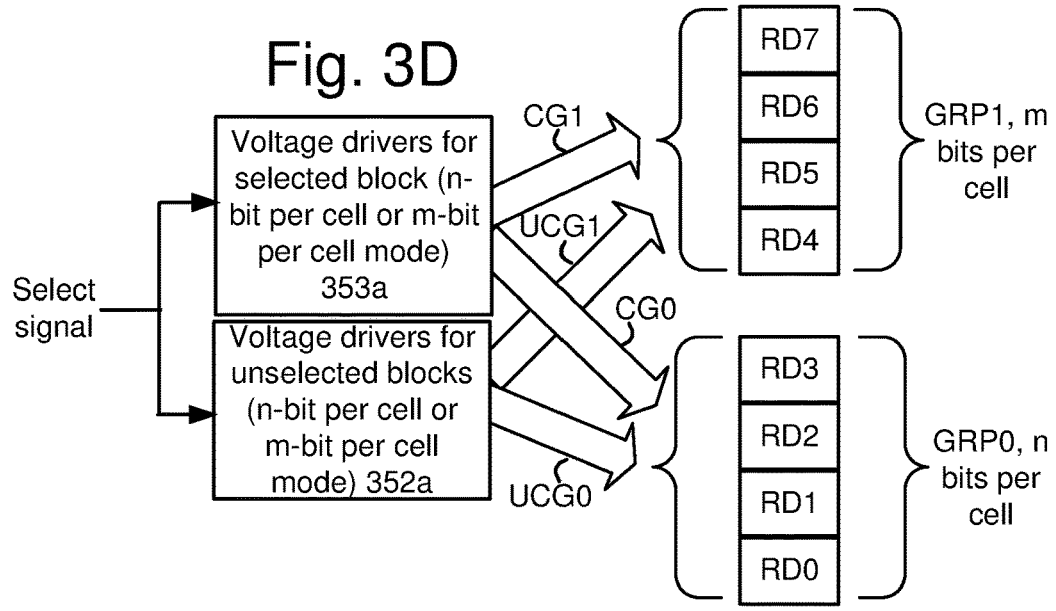
FIG. 3D depicts another example implementation of the power control circuit 115 of FIG. 1A for providing voltages to blocks of memory cells, where common voltage drivers are provided for n-bit per cell and m-bit per cell blocks.

FIG. 3D depicts another example implementation of the power control circuit 115 of FIG. 1A for providing voltages to blocks of memory cells, where common voltage drivers are provided for n-bit per cell and m-bit per cell blocks. In this case, voltage drivers 353a are provided for a selected block and operate in an n-bit per cell or m-bit per cell mode based on a select signal, which is a control signal from a control circuit. Voltage drivers 352a are provided for unselected blocks and operate in an n-bit per cell or m-bit per cell mode based on the select signal. This approach can reduce the amount of circuitry. In the n-bit per cell mode, the voltage drivers 353a provide the voltage signals CG0 to GRP0 and the voltage drivers 352a provide the voltage signals UCG0 to GRP0. In the m-bit per cell mode, the voltage drivers 353a provide the voltage signals CG1 to GRP1 and the voltage drivers 352a provide the voltage signals UCG1 to GRP1.

In the approaches of FIGS. 3A and 3D, one or more of the voltage drivers are connected to a set of row decoders for a first group of blocks and to a set of row decoders for a second group of blocks. The one or more voltage drivers are configured to output a first voltage signal to the row decoders for the unselected blocks of the first group of blocks during a respective read operation of the selected word line of a selected block of the first group of blocks, and to output a second voltage signal to the row decoders for the unselected blocks of the second group of blocks during a respective read operation of a selected word line of the selected block of the second group of blocks.

Figure 3E:
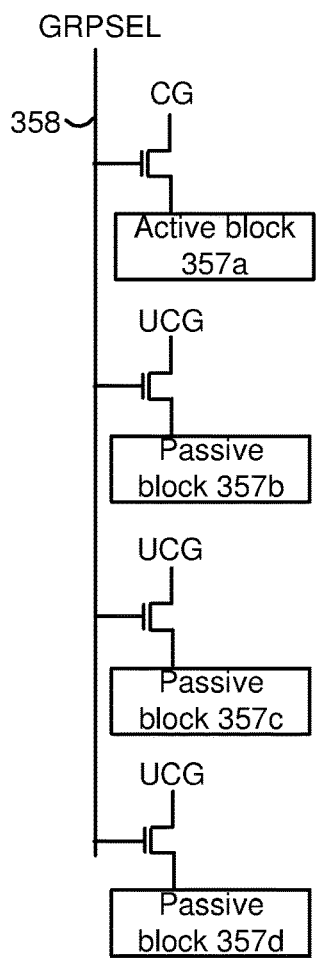
FIG. 3E depicts an example of an active block 357a and passive blocks 357b-357d in a group of blocks, consistent with FIG. 3A-3D.

FIG. 3E depicts an example of an active block 357a and passive blocks 357b-357d in a group of blocks, consistent with FIG. 3A-3D. An active block can refer to a selected block which is being read, while a passive block can refer to an unselected block, which is not being read. As mentioned, the blocks in a group of blocks share a common group selected signal, GRPSEL, on a group select line 358. Further, among the blocks in a group, if a block is accessed (read) first and then remains passive while the other blocks in the same group are being accessed, such accessed blocks can be referred to as "first accessed blocks." Word lines of the first accessed blocks receive the UCG bias, while another block in the same group is being accessed with the CG bias.

Since a group of blocks consists of multiple blocks, a majority of the blocks will be in the "first accessed block" condition. It is desirable to improve DRD in the first accessed blocks.

In the group of blocks shown, if some of the blocks were SLC and others were MLC, the common bias UCG could not be optimized for both types of blocks. For example, a low value of UCG would be optimal for the SLC blocks but will cause the MLC blocks to transition to the first read state. A high value of UCG would be optimal for MLC blocks but could cause DRD for the SLC blocks. By dedicating the blocks in a group to storing the same number of bits per cell, UCG can be optimized for each block. The SLC blocks can receive an optimal UCG and the MLC blocks can receive a different optimal UCG. This approach solves a fundamental conflict between reducing read errors in SLC block and in MLC block (e.g., three- and four-bit per cell blocks) in memory devices such as 3D NAND. For SLC blocks, it is desirable to keep the word line voltage relatively low when the blocks are not being operated on, while for MLC blocks, it is desirable to keep the word line voltages relatively high.

The techniques described herein achieve this by having a dedicated set of SLC blocks and implementing a separate design for these blocks. Once a separate group of SLC blocks is provided, implementing the separate design can be achieved in two ways, for example. A first approach provides physically separate connections (such as CG/UCG lines) for the SLC group of blocks and for the MLC group of blocks, such as in FIG. 3A. In this way, the SLC blocks can be handled differently than the MLC blocks.

A second approach provides the same connection lines (such as CG/UCG lines) for both the SLC blocks and the MLC blocks. Then, during an operation such as a read operation, a determination is made as to whether the operation is being conducted on the dedicated SLC group of blocks or the MLC group of blocks. Based on this determination, a corresponding set of voltage waveforms (e.g., having corresponding voltage amplitudes and timings) is applied for that group of blocks (even for passive or unselected blocks in that group) and the connected circuitry. This can include a different refresh read amplitude for an SLC group compared to an MLC group.

The techniques provide a tradeoff between reducing DRD read errors and first read state errors to minimize errors on both SLC and MLC blocks. The techniques also increase the read disturb capability of the memory device without increasing errors due to a first read state to second read state transition. This provides a significant improvement especially at the end of the life of a block. The techniques also reduce failure rates, increase yield and reduce ECC frequency (thereby improving cost efficiency).

Figure 3F:
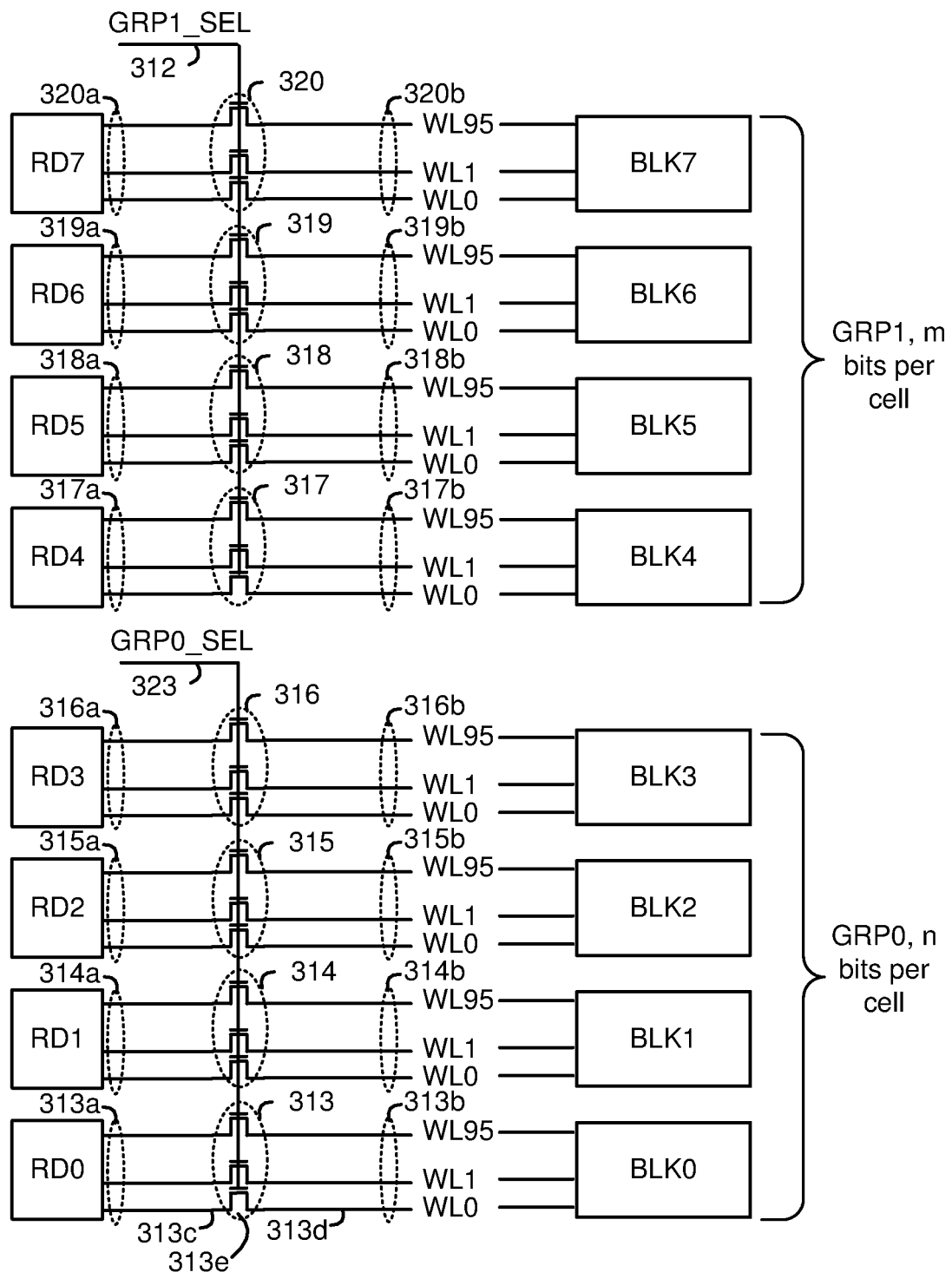
FIG. 3F depicts further example details of the pre-switch control lines 325, pass transistors 322 and post-switch control line 303 of FIG. 3A.

FIG. 3F depicts further example details of the pre-switch control lines 325, pass transistors 322 and post-switch control line 303 of FIG. 3A. In GRP0, RD0 is connected to the pre-switch control lines 313a, the pass transistors 313 and the post-switch control lines 313b, e.g., word lines WL0, WL1, WL95 of BLK0. An example pre-switch control line 313c is connected to a drain terminal of respective pass transistor 313e, which in turn has a source terminal connected to a respective post-switch control line 313d, e.g., WL0. RD1 is connected to the pre-switch control lines 314a, the pass transistors 314 and the post-switch control lines 314b of BLK1. RD2 is connected to the pre-switch control lines 315a, the pass transistors 315 and the post-switch control lines 315b of BLK2. RD3 is connected to the pre-switch control lines 316a, the pass transistors 316 and the post-switch control lines 316b of BLK3. The first group select signal for GRP0, GRP0_SEL, is provided on the first group select line 323 to the control gates of the pass transistors 313-316. The pass transistors may be MOSFETs which are conductive when the voltage on the control line is sufficiently high, e.g., GRP0_SEL is asserted, and non-conductive when the voltage on the control line is sufficiently low or 0 V, e.g., GRP0_SEL is de-asserted (not asserted).

In GRP1, RD4 is connected to the pre-switch control lines 317a, the pass transistors 317 and the post-switch control lines 317b, e.g., word lines WL0-WL95 of BLK4. RD5 is connected to the pre-switch control lines 314a, the pass transistors 318 and the post-switch control lines 318b of BLK5. RD6 is connected to the pre-switch control lines 319a, the pass transistors 319 and the post-switch control lines 319b of BLK6. RD7 is connected to the pre-switch control lines 320a, the pass transistors 320 and the post-switch control lines 320b of BLK7. The second group select signal for GRP1, GRP1_SEL, is provided on the second group select line 312 to the control gates of the pass transistors 317-320. The pass transistors may be MOSFETs, as discussed, which are conductive when GRP1_SEL is asserted and non-conductive when GRP1_SEL is de-asserted.

As mentioned, when a group of blocks is selected, the word line voltages of the associated blocks are no longer floating and are instead driven by a voltage which is provided by the row decoders. In one scenario, a group of blocks is selected to perform a read operation on a selected block of the group. For the selected block, a control gate read voltage can be applied to a selected word line while read pass voltages are applied to the unselected word lines. These voltages are referred to as CG in FIGS. 3A, 3D and 3E. At the same time, a refresh operation can be performed for the unselected blocks by applying a common refresh voltage signal to the word lines of the unselected blocks. This voltage is referred to as UCG in FIGS. 3A, 3D and 3E. Examples are provided in FIG. 13.

For example, in GRP0, BLK0 can be a selected block and BLK1-BLK3 can be unselected blocks. The refresh voltage signal for GRP0 can be a first voltage signal which is tailored to the characteristics of the GRP0 blocks, including the number n of bits per cell. The refresh voltage signal for GRP1 can be a second voltage signal, different than the first voltage signal, which is tailored to the characteristics of the GRP1 blocks, including the number m of bits per cell, where m>n. The two refresh voltage signals can be different in terms of amplitudes and timing, e.g., duration, for example.

There can be multiple groups of blocks which store n bits per cell and multiple groups of blocks which store m groups per cell on the memory device. Generally, there can be two or more types of groups of block, where each type stores a different number of bits per cell. The refresh voltage signals can be tailored to each type of group to optimize a refresh operation by minimizing read errors.

FIG. 4 is a perspective view of a memory device 400 comprising the blocks BLK0-BLK7 of FIG. 3A in an example 3D configuration. On the substrate are the example blocks BLK0-BLK7 of memory cells (storage elements) and peripheral areas with circuitry for use by the blocks. The peripheral area 404 runs along an edge of each block while the peripheral area 405 is at an end of the set of blocks. The circuitry can include voltage drivers which can be connected to control gate layers, bit lines and source lines of the blocks. In one approach, control gate layers at a common height in the blocks are commonly driven. The substrate 451 can also carry circuitry under the blocks, and one or more lower metal layers which are patterned in conductive paths to carry signals of the circuitry. The blocks are formed in an intermediate region 452 of the memory device. In an upper region 453 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While eight blocks are depicted as an example, typically there are many more blocks extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 5:
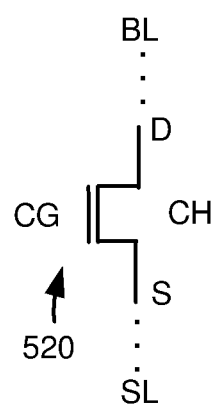
FIG. 5 depicts an example transistor 520.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string.

Figure 6:
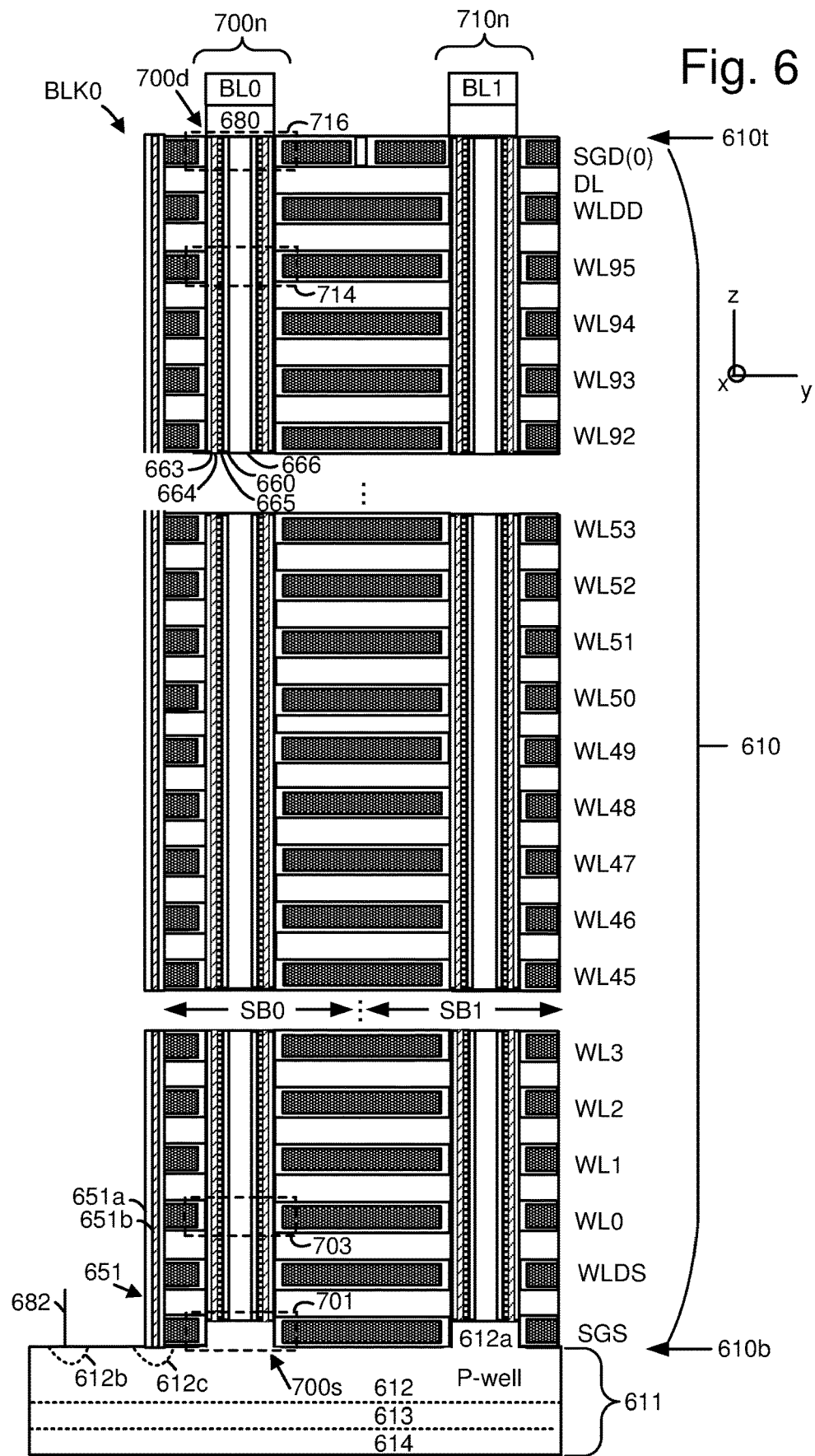
FIG. 6 depicts an example cross-sectional view of a portion of the block BLK0 of FIG. 4, including NAND strings 700n and 710n.

FIG. 6 depicts an example cross-sectional view of a portion of the block BLK0 of FIG. 4, including NAND strings 700n and 710n. In this example, the NAND strings 700n and 710n are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3A) connected to the source ends of the NAND strings. The p-well region may comprise epitaxial regions 612 which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

FIG. 7A depicts an example view of NAND strings in the block BLK0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

Another option is to program each sub-block before proceeding to the next sub-block. For example, SB0 may be programmed in WL0-WL95, then SB1 may be programmed in WL0-WL95, and so forth.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor

756. NAND string 730*n* includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 7B:
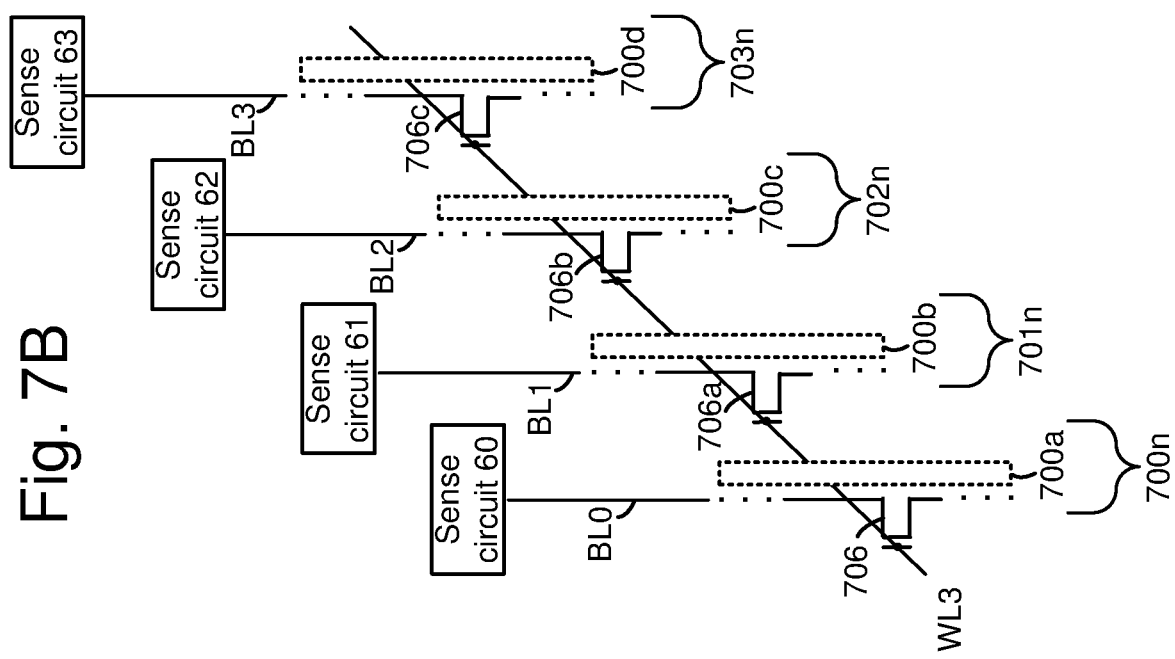
FIG. 7B depicts an example view of memory cells connected to WL3 in the sub-block SB0 of FIG. 7A, with respective NAND strings, bit lines and sense circuits.

FIG. 7B depicts an example view of memory cells connected to WL3 in the sub-block SB0 of FIG. 7A, with respective NAND strings, bit lines and sense circuits. The memory cell 706 and channel 700*a* of the NAND string 700*n* in SB0 of FIG. 7A are depicted, along with a respective bit line BL0. SB0 also includes memory cells 706*a*, 706*b* and 706*c* in NAND strings 701*n*, 702*n* and 703*n*, respectively, which have channels 700*b*, 700*c* and 700*d*, respectively, and which are connected to bit lines BL1, BL2 and BL3, respectively. The bit lines BL0-BL3 are connected to the sense circuits 60-63, respectively, of FIG. 2.

In a program loop, the memory cells 706 and 706*a* could be examples of selected and unselected memory cells, respectively, in which case the NAND strings 700*n* and 701*n* are examples of selected and unselected NAND strings, respectively, and the bit lines BL0 and BL1 are examples of selected and unselected bit lines, respectively.

Figure 8A:
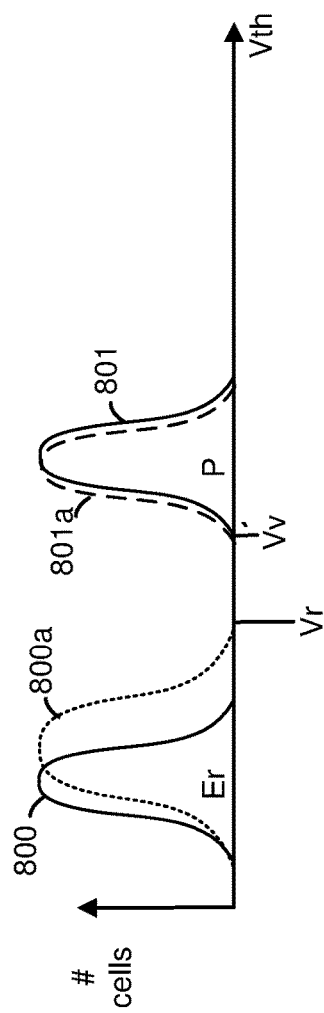
FIG. 8A depicts example Vth distributions of SLC memory cells storing one bit per cell.
Figure 8B:
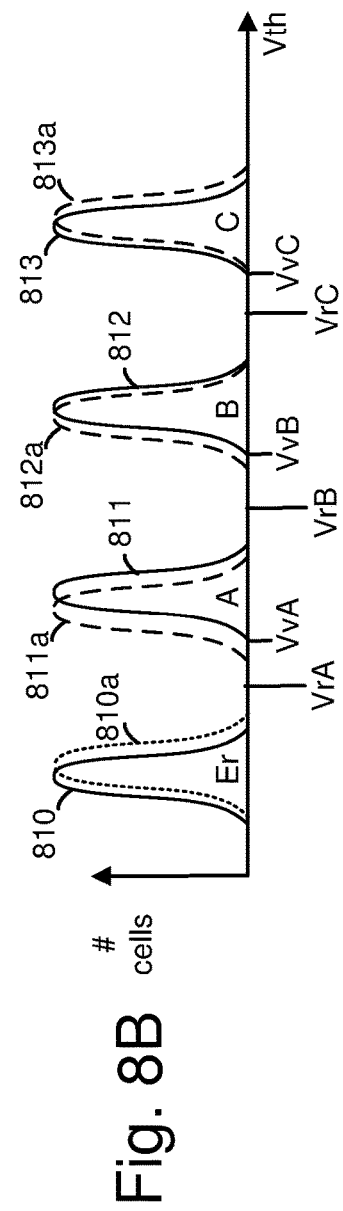
FIG. 8B depicts example Vth distributions of MLC memory cells storing two bits per cell.
Figure 8C:
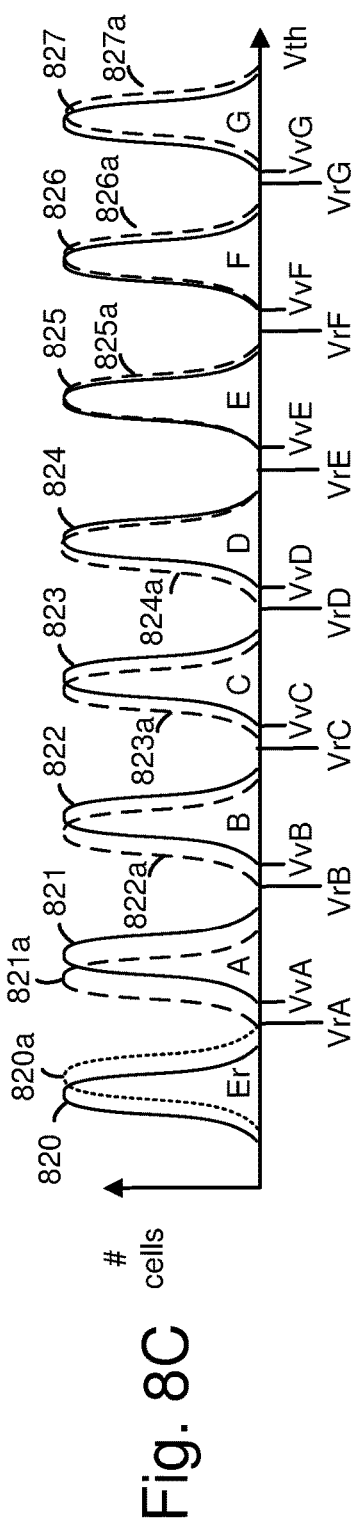
FIG. 8C depicts example Vth distributions of MLC memory cells storing three bits per cell.

FIG. 8A depicts example Vth distributions of SLC memory cells storing one bit per cell. In FIG. 8A to 8C, the vertical axis represents a number of memory cells on a logarithmic scale and the horizontal axis represents Vth in Volts.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

The Vth distributions 800 and 800*a* represent an erased state (Er) without and with DRD, respectively. The higher Vth distribution 800*a* is caused by DRD, which increases the Vth of the upper tail of the erased state memory cells. The Vth distributions 801 and 801*a* represent a programmed data state (P) in the second and first read states, respectively. The higher Vth distribution 801 is caused by a coupled up word line voltage, while the lower Vth distribution 801*a* is caused by a discharge in the word line voltage.

A verify voltage for the programmed state is Vv and a read voltage for distinguishing between the two states is Vr.

DRD is caused primarily by residual voltages on the word lines. These voltages cause temperature-dependent charge hopping through the traps generated in the dielectric tunneling layer 665 during program-erase cycling. This charge movement under the influence of the residual word line voltages results in a continuous erased state upshift as long as the residual word line voltage persists.

For heavily cycled SLC blocks in particular, DRD is a reliability problem and can prevent a memory device from meeting read disturb and data retention specifications. Moreover, DRD is expected to worsen in future memory devices if appropriate countermeasures such as provided herein are not implemented. DRD also affects the specifications regarding operating temperatures and the qualification of the memory device based on P-E cycles. Furthermore, with the increase in MLC endurance requirements, DRD is expected to be a concern for MLC blocks as well.

Discharging the residual word line voltages helps reduce DRD, but pushes the memory cells into the undesired first read state. This increases read errors since the read voltages are tuned to the second read state. A solution is to optimize refresh operations which provide the memory cells in an optimum state for reading. The refresh operations can be performed by applying a voltage signal to the word lines which has an amplitude which is sufficiently high to maintain the programmed memory cells in the second read state while minimizing DRD for the erased state memory cells.

An optimal solution observes that blocks which are more susceptible to DRD errors are different from blocks which are more susceptible to first read state errors. For example, SLC blocks, especially at the end of life, are more susceptible than MLC blocks to DRD. Further, MLC blocks are more susceptible than SLC blocks to first read state errors due to much smaller margins between the Vth distributions of adjacent data states.

An optimum solution can adjust the amplitude of the refresh voltage signal for a block based on the susceptibility of the block to DRD and first read state errors. The amplitude can range from a high level such as Vread, which is typically the highest voltage applied to the unselected word lines during read operations, to Vss or even a negative voltage if available on the memory device.

Three example scenarios are discussed. In a first scenario, the amplitude is a high level such as Vread. This can be optimal for blocks which are less susceptible to DRD errors but need to be kept in the second read state to avoid first read state errors. Such blocks can include MLC blocks with relatively low P-E cycles, e.g., less than P-E_th2 in FIG. 11B. See FIG. 14A for an example scenario of read operations and refresh operations using a high amplitude refresh voltage signal.

In a second scenario, the amplitude is an intermediate level such as Vint1 or Vint2 (FIG. 11B). This can be optimal for groups of blocks which are susceptible to DRD errors but need to be strictly kept in the second read state. Such groups of blocks can include MLC blocks, e.g., with three bits per cell, with relatively high P-E cycles, e.g., greater than P-E_th2 in FIG. 11B. See FIG. 14B for an example scenario of read operations and refresh operations using an intermediate amplitude refresh voltage signal.

In this case, a tradeoff is made between the requirements to reduce both DRD errors and first state errors. The intermediate level, which is between the highest and lowest amplitudes, can be determined based on factors such as the workload, e.g., the expected frequency of read operations. If the expected frequency is relatively high, the intermediate level can be relatively low, since the read operations will provide a frequent coupling up of the word line voltages. The intermediate level should maintain the word line voltages in a range which is sufficiently high to avoid the first read state errors and sufficiently low to avoid the DRD errors.

In a third scenario, the amplitude is a low level such as Vss or a negative voltage (FIG. 11B). This can be optimal for groups of blocks which are highly susceptible to DRD errors and need not be kept in the second read state. Such groups of blocks can include SLC blocks with relatively high P-E cycles, e.g., greater than P-E_th1 in FIG. 11B. See FIG. 14C for an example scenario of read operations and refresh operations using an intermediate amplitude refresh voltage signal.

In general, characteristics of the of the refresh voltage signal such as the amplitude, frequency and duration or pulse width can be optimized considering factors such as the operating temperature, user/system workload, number of P-E cycles and number of bits per cell. Moreover, these characteristics can be dynamically adjusted based on factors such as changes in temperature, which can affect the discharge rate of the word line voltage and the magnitude of the DRD. The characteristics can also be adjusted based on a change in the precision of a program operation which affects the margins between the data states, and hence the susceptibility to DRD or first read state errors. A higher precision corresponds with larger margins between adjacent states. One example of increasing the program precision, and decreasing the Vth widths for each state, is performing a multi-pass program operation instead of a single pass program operation, and/or programming using a smaller step size.

For example, the refresh voltage amplitude can be relatively low for MLC blocks with a relatively high precision and a relatively high margin between adjacent states. In this case, a larger Vth downshift can reduce DRD for the erased state without causing first read state errors for the programmed states.

FIG. 8B depicts example Vth distributions of MLC memory cells storing two bits per cell. The Er state without and with DRD is represented by the Vth distributions 810 and 810a, respectively. The A-C data states are represented by the Vth distributions 811-813, respectively, in the second read state, and by the Vth distributions 811a-813a, respectively, in the first read state. The verify voltages are VvA-VvC, and the read voltages are VrA-VrC. The Vth downshift due to being in the first read state is greater for the A state than for the B and C states in this example. For the higher data states, the coupling up voltage between the channel and the word line is typically not strong enough to trap more electrons in the charge trapping layer of a memory cell. This is due to a screening effect of the electrons which are already present in the charge trapping layer of the memory cell and provide the high Vth. Instead, the electrons in the charge trapping layer are more attracted towards the control gate/word line, further away from the channel, resulting in a Vth downshift. Data retention effects may also be present for the higher data states, where charge is lost from the charge trapping layer, resulting in a Vth downshift.

FIG. 8C depicts example Vth distributions of MLC memory cells storing three bits per cell. The Er state without and with DRD is represented by the Vth distributions 820 and 820a, respectively. The A-G data states are represented by the Vth distributions 821-827, respectively, in the second read state, and by the Vth distributions 821a-827a, respectively, in the first read state.

The verify voltages of the A-G states are VvA-VvG, respectively. A set of read voltages for the A-G states includes VrA-VrG, respectively. The read voltages can be optimized for the second read state, in one approach. In this example, the Vth distributions 821-824 for the A-D states, respectively, have a Vth upshift in the second read state. The Vth distributions 826 and 827 for the F and G states, respectively, have a small Vth downshift, in the second read state.

Generally, it is helpful for the memory cells with the programmed data states, but harmful to the erased state memory cells, to use a high amplitude for the periodic refresh voltage operations. The amplitude should therefore be carefully set based on various factors as described herein.

Figure 9A:
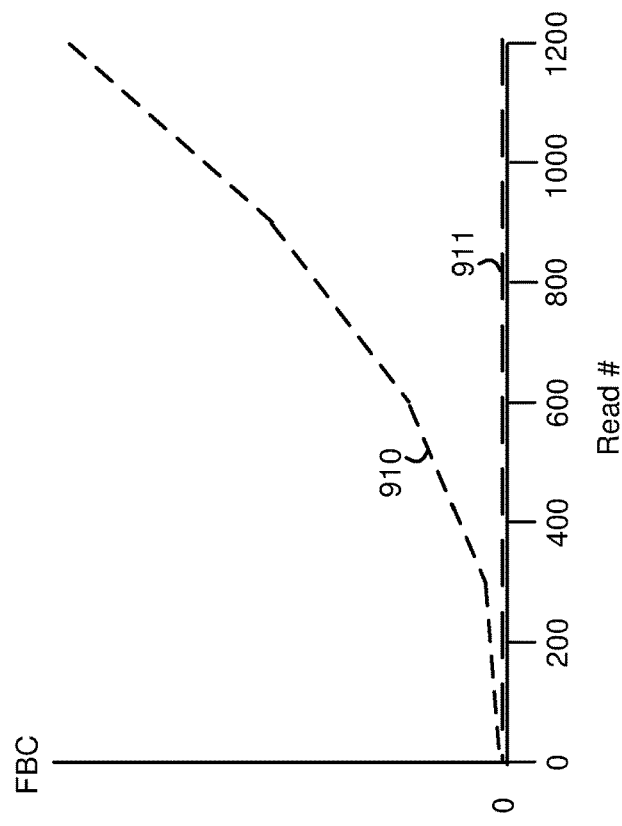
FIG. 9A depicts a plot of an average upper tail Vth of erased state memory cells as a function of a number of read operations.

FIG. 9A depicts a plot of an average upper tail Vth of erased state memory cells as a function of a number of read operations, ranging from 1-1200. The vertical and horizontal axes are on linear scales. The data is at a room temperature of 25 C, for SLC memory cells with 100 K P-E cycles. Read refresh operations are not performed. The Vth increases as additional read operations are performed due to an increase in delayed read disturb. The Vth increases relatively quickly and then more slowly as additional read operations are performed. SLC memory cells in particular are affected by DRD.

Figure 9B:
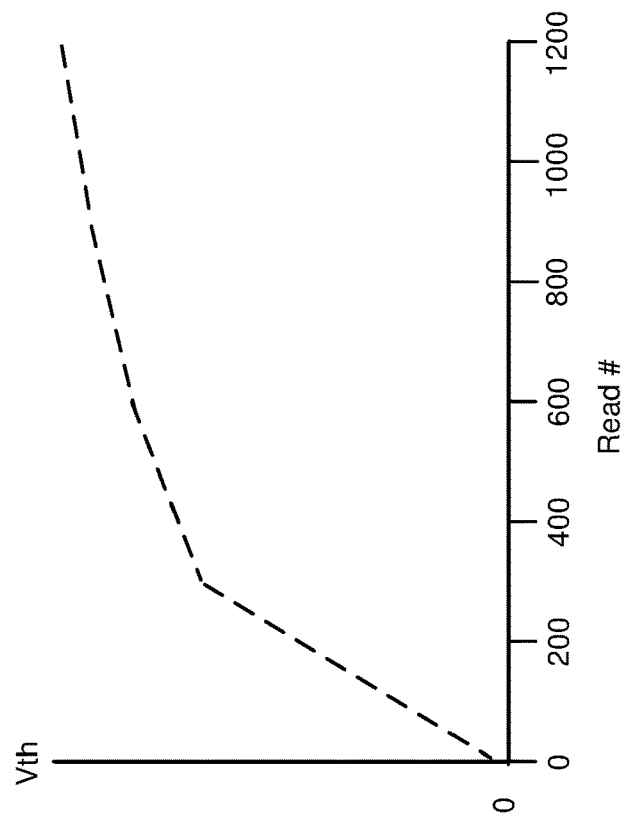
FIG. 9B depicts plots of a fail bit count (FBC), or number of read errors, as a function of a number of read operations, for SLC memory cells (plot 910) and MLC memory cells (plot 911).

FIG. 9B depicts plots of a fail bit count (FBC), or number of read errors, as a function of a number of read operations, for SLC memory cells (plot 910) and MLC memory cells (plot 911). The vertical and horizontal axes are on linear scales. The FBC is an average value and is normalized to 0 for both SLC and MLC cells. The data is at a room temperature of 25 C. Plot 910 is for SLC memory cells with 100 K P-E cycles and plot 911 is for MLC memory cells with 3 K P-E cycles. The memory cells are at their end of life. Read refresh operations are not performed.

The FBC increases much more quickly for the SLC cells than for the MLC cells due to delayed read disturb. Generally, DRD has a greater effect when there are fewer bits per cell. One reason for this difference is that the MLC cells have a much shorter lifetime in terms of P-E cycles because the MLC cells endure greater stress during programming SLC cells have a longer lifetime and therefore experience DRD as the P-E cycles accumulate. There are other distinguishing factors as well between SLC and MLC cells which make the SLC cells more susceptible to DRD. As mentioned, a countermeasures for DRD involves discharging word line voltages. However, this increase the risk of first read state errors, especially for MLC cells.

A solution involves providing dedicated groups of blocks on a memory chip which are reserved for storing a predetermined number of bits per cell. For example, some groups can be reserved or SLC cells and other groups reserved for MLC cells. Further, the refresh voltage signals can be tailored (optimized) to each type of group based on the number of bits per cell. Optimizing the refresh voltage signals results in minimizing read errors. In the optimization, the amplitudes and timing of the refresh voltage signals can differ for each group of blocks based on the number of bits per cell.

FIG. 10A-10D provides example of different of the effects of different voltage signals on the erased state upper tail Vth. The vertical axis depicts the erased state upper tail Vth on a linear scale and the horizontal axis depicts the number of read operations on a linear scale. The data is for SLC cells with 75 K P-E cycles at a high temperature of 85 C. In a group of blocks, the selected block is actively read while the unselected blocks are passive blocks which are biased when the selected block is read. In each of these figures, each plot implies a different design setting in the memory device.

Figures 10A, 10B, 10C, 10D:
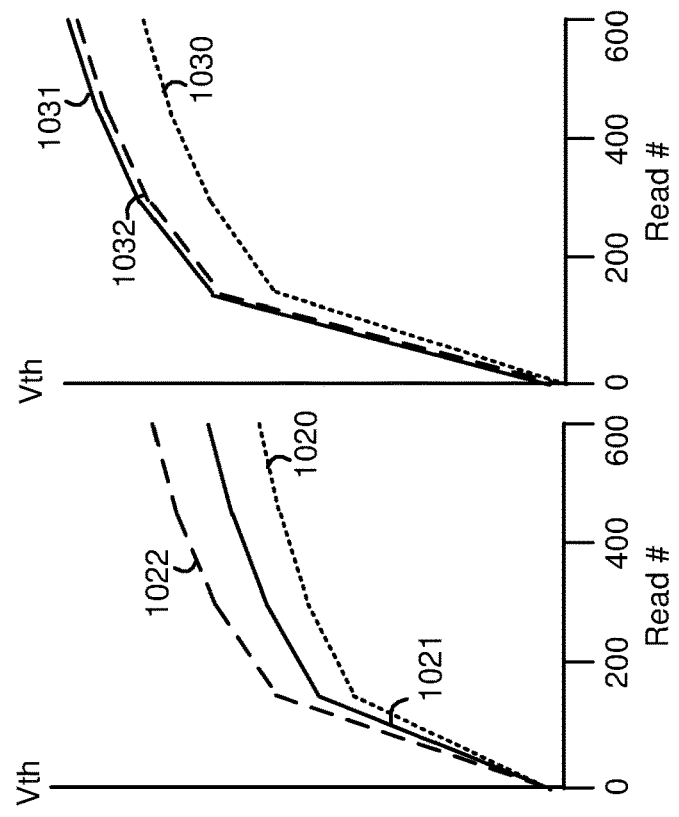
FIG. 10A depicts plots of an average upper tail Vth of erased state SLC memory cells as a function of a number of read operations and different refresh voltages for an unselected block in a group of blocks.
FIG. 10B depicts plots of an average upper tail Vth of erased state SLC memory cells as a function of a number of read operations and different refresh voltages for a selected block in a group of blocks, consistent with FIG. 10A.
FIG. 10C depicts another example of plots of an average upper tail Vth of erased state SLC memory cells as a function of a number of read operations and different refresh voltages for an unselected block in a group of blocks.
FIG. 10D depicts another example of plots of an average upper tail Vth of erased state SLC memory cells as a function of a number of read operations and different refresh voltages for a selected block in a group of blocks, consistent with FIG. 10C.
Figure 13:
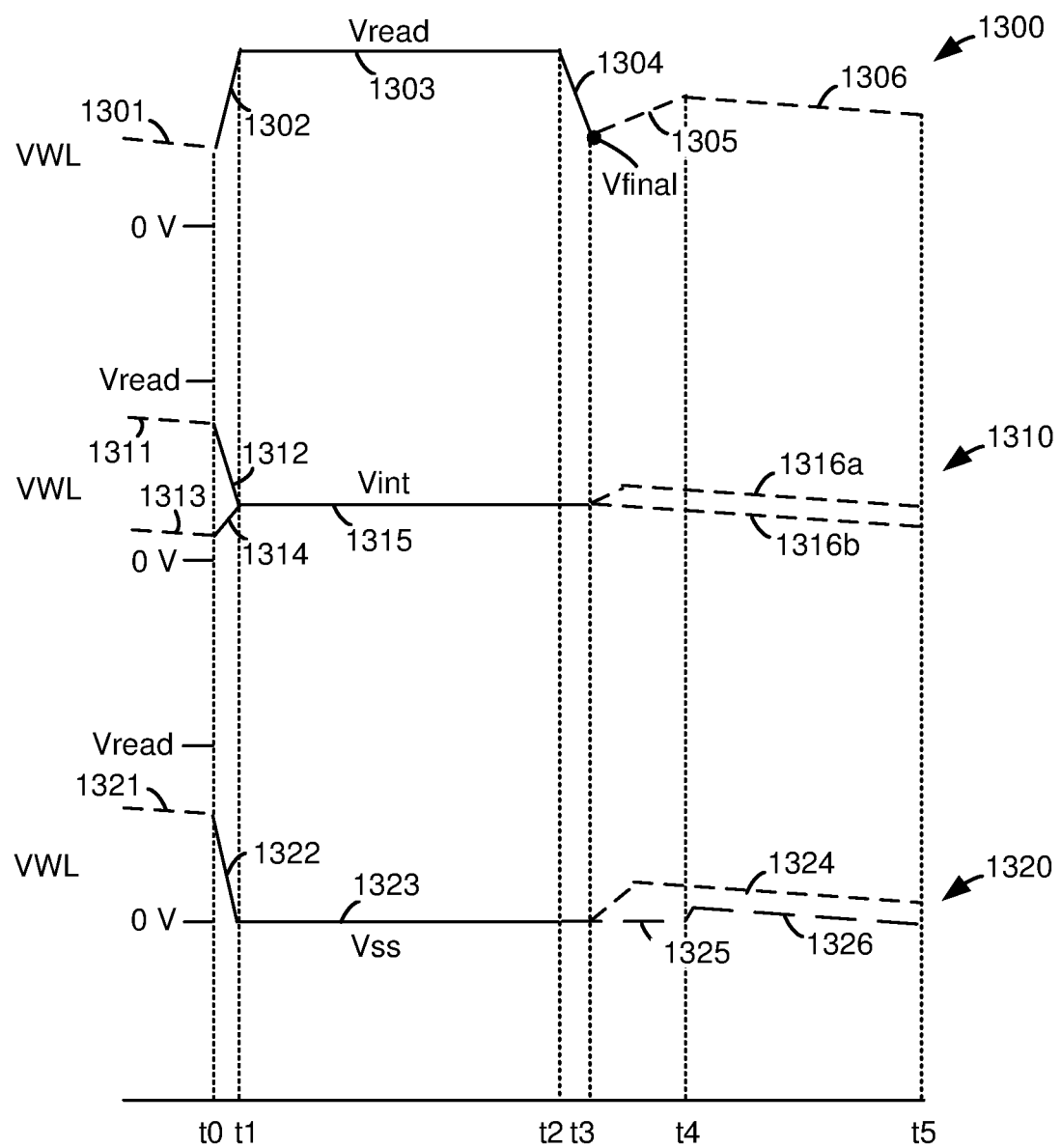
FIG. 13 depicts examples of word line voltages during refresh operations for high, intermediate and low amplitude refresh voltages.

FIG. 10A depicts plots of an average upper tail Vth of erased state SLC memory cells as a function of a number of read operations and different refresh voltages for an unselected block in a group of blocks. Plot 1000 represents a refresh voltage amplitude of Vcelsrc=1 V. Plot 1001 represents a refresh voltage amplitude of Vss=0 V. Plot 1002 represents a refresh voltage amplitude of 4 V. Also, with plots 1000 and 1001, the refresh voltage amplitude is held for a period of time after the read occurs, such as with the examples of FIG. 13, plots 1310 and 1320. With plot 1002, the refresh voltage amplitude is a final voltage Vfinal during a voltage ramp down on the word lines at the time the pass transistors are turned off, such as with the example of FIG. 13, plots 1300. The plots show that a lower refresh voltage amplitude is better for SLC cells since it results in a lower Vth upper tail.

FIG. 10B depicts plots of an average upper tail Vth of erased state SLC memory cells as a function of a number of read operations and different refresh voltages for a selected block in a group of blocks, consistent with FIG. 10A. Plot 1010 represents a refresh voltage amplitude of Vcelsrc=1 V, and is similar to plot 1000. Plot 1011 represents a refresh voltage amplitude of Vss=0 V, and is similar to plot 1001. Plot 1012 represents a refresh voltage amplitude of 4 V and is slightly higher than plot 1002. The read operations on the selected block increase the Vth.

FIG. 10C depicts another example of plots of an average upper tail Vth of erased state SLC memory cells as a function of a number of read operations and different refresh voltages for an unselected block in a group of blocks. The refresh voltage amplitude is a final voltage at the time the pass transistors are turned off at the end of the read operation. Plot 1020 represents a refresh voltage amplitude of Vdd=2 V. Plot 1021 represents a refresh voltage amplitude of 3 V. Plot 1012 represents a refresh voltage amplitude of 4 V. The plots show that the Vth increases progressively as the refresh voltage amplitude increases.

FIG. 10D depicts another example of plots of an average upper tail Vth of erased state SLC memory cells as a function of a number of read operations and different refresh voltages for a selected block in a group of blocks, consistent with FIG. 10C. Plot 1030 represents a refresh voltage amplitude of Vdd=2 V. Plot 1031 represents a refresh voltage amplitude of 3 V. Plot 1032 represents a refresh voltage amplitude of 4 V. The plots show that the Vth increases as the refresh voltage amplitude increases. However, the two higher amplitudes result in a similar Vth for the selected block (plots 1031 and 1032), while there is a distinct difference in Vth for the unselected blocks with the two higher amplitudes (plots 1021 and 1022).

The plots indicate that the refresh operations can help reduce read errors for erased state memory cells. For example, the refresh operations can be optimized by adjusting the amplitude of a refresh voltage signal based on the number of bits per cell in a block.

The amplitude can also be optimized based on the number of P-E cycles. In one approach, an active wear leveling process can be provided for a group of blocks so that they have a similar number of P-E cycles. As a result, a common optimum refresh voltage can be used for the block of a group even as the P-E cycles increase. The number of P-E cycles can be tracked by enterprise solid state devices (SSD) and client SSD systems. One solution is to classify blocks into different categories such as beginning, middle and end of life, based on the readings of P-E cycle counters.

A further optimization can be made based on temperature.

Generally, the refresh operations can provide an optimal tradeoff between minimizing read errors due to DRD and due to memory cells entering the first read state. As a system level solution, the refresh operations can be applied selectively for groups of blocks that are at higher risk of DRD errors or first read state errors without impacting other blocks. The refresh operations are applicable for both SLC and MLC. The refresh operations can increase the read disturb capability of a memory device without increasing errors due to a transition from the first read state to the second read state, which is especially important for end of life blocks. The refresh operations can help reduce failure rates, increasing yield and reducing ECC frequency, thereby reducing costs.

FIG. 11A depicts a flowchart of an example process for refreshing word line voltages in a group of blocks. Step 1100 involves beginning a read operation for a selected block in group of blocks storing a predetermined number of bits per cell. That is, the blocks are reserved for storing a predetermined number of bits per cell. Accordingly, refresh voltage signals which are optimum for the number of bits per cell can be applied to each group of blocks. Step 1101 includes asserting a block select signal for the group of blocks to provide pass transistors in a conductive state. This results in driving of the word line voltages. Step 1102 includes applying a control gate read voltage to a selected word line of the selected block. See FIGS. 12A and 12B. At the same time, step 1103 includes applying a read pass voltage to the unselected word lines of the selected block.

Step 1104 includes sensing the memory cells connected to the selected word line. Step 1105 includes ramping down the voltage on the unselected word lines. Step 1106 includes de-asserting the group selected signal for the group of blocks to provide the pass transistors in a non-conductive state. This results in floating of the word line voltages.

Step 1107 can be performed concurrently for the unselected blocks with the reading of the selected block. Step 1107 includes applying a refresh voltage signal to the word lines of the unselected blocks in the group, where the voltage signal is tailored to refresh floating word line voltages based on the predetermined number of bits per cell.

The steps 1101, 1107 and 1106 can be followed in periodic refresh operations which follow the read operation. In an example implementation, after a respective read operation for a selected word line of a selected block of a first group of blocks, a set of row decoders for the first group of blocks are configured to periodically and concurrently apply a first voltage signal to the word lines of each block of the first group of blocks, and after a respective read operation for a selected word line of a selected block of a second group of blocks, a set of row decoders for the second group of blocks are configured to periodically and concurrently apply the second voltage signal to the word lines of each block of the second group of blocks.

In another scenario, a read operation is not performed for the group. Instead, all blocks in the group are subject to a refresh operation. In this case, steps 1101, 1107 and 1106 are followed but the refresh voltage signal of step 1107 is applied to each block in the group. In one approach, multiple groups of blocks can be refreshed concurrently.

Generally, the refresh operations can be carried out a fixed intervals. Although, if a read command is received at the same time a refresh operation is scheduled, the read command can take priority and the refresh operation can be performed after the completion of the read operation. See FIG. 14A-14C for examples.

In an example implementation, a method includes performing a first voltage refresh operation for word lines of a first group of blocks of memory cells, the performing the first voltage refresh operation comprises connecting a first voltage signal from a voltage driver to a first set of pass transistors connected to the word lines of the first group of blocks, and asserting a group select signal for the first set of pass transistors, where the first voltage signal is tailored to refreshing floating voltages of the word lines of the first group of blocks when the memory cells of the first group of blocks store n bits per cell. The method further includes, separately from the performing of the first voltage refresh operation, performing a second voltage refresh operation for word lines of a second group of blocks of memory cells, the performing the second voltage refresh operation comprises connecting a second voltage signal from the voltage driver to a second set of pass transistors connected to the word lines of the second group of blocks, and asserting a group select signal for the second set of pass transistors, where the second voltage signal is tailored to refreshing floating voltages of the word lines of the second group of blocks when the memory cells of the second group of blocks store m>n bits per cell.

FIG. 11B depicts an example table of the refresh voltage signal setting circuit 119 of FIG. 1A, for use in FIG. 11A, step 1107. As mentioned, the amplitude of the refresh voltage signal in the refresh operation can be optimized based on factors such as the number of bits per cell and the number of P-E cycles. In this example, the number of P-E cycles is classified as being low if below a threshold or high if at or above the threshold. For example, for an SLC block, if the number of P-E cycles is below a first threshold, P-E_th1, the amplitude of the refresh voltage signal can be a first intermediate voltage, Vint1. If the number of P-E cycles is at or above P-E_th1, the amplitude of the refresh voltage signal can be 0 V or a negative voltage. This approach is based on an increased susceptibility to DRD errors at higher P-E cycles for SLC blocks, with a relatively small concern for maintaining the second read state. Lowering the refresh voltage signal aggressively to a low level such as Vss helps reduce DRD errors as P-E cycles increase.

For an MLC block, if the number of P-E cycles is below a second threshold, P-E_th2, the amplitude of the refresh voltage signal is Vhigh, such as Vread. If the number of P-E cycles is at or above P-E_th2, the amplitude of the refresh voltage signal is a second intermediate voltage, Vint2. In one approach, P-E_th2<P-E_th1. For example, P-E_th2 can be 5 K in an MLC block which has a lifetime of 10 K P-E cycles, and P-E_th1 can be 50K in an SLC block which has a lifetime of 100 K P-E cycles. Additionally, Vint2 can be greater than Vint1 since maintaining the programmed memory cells in the second read state tends to be more important for MLC blocks than for SLC blocks.

This approach is also based on an increased susceptibility to DRD errors at higher P-E cycles for erased cells in MLC blocks, while balancing the need to also maintain the second read state for the programmed cells. Lowering the refresh voltage signal modestly to an intermediate level helps reduce DRD errors while maintaining the second read state for the programmed cells as P-E cycles increase. Lowering the refresh voltage signal to 0 V would likely be an overcompensation for reducing DRD errors at the expense of increasing first read state errors.

Figure 12A:
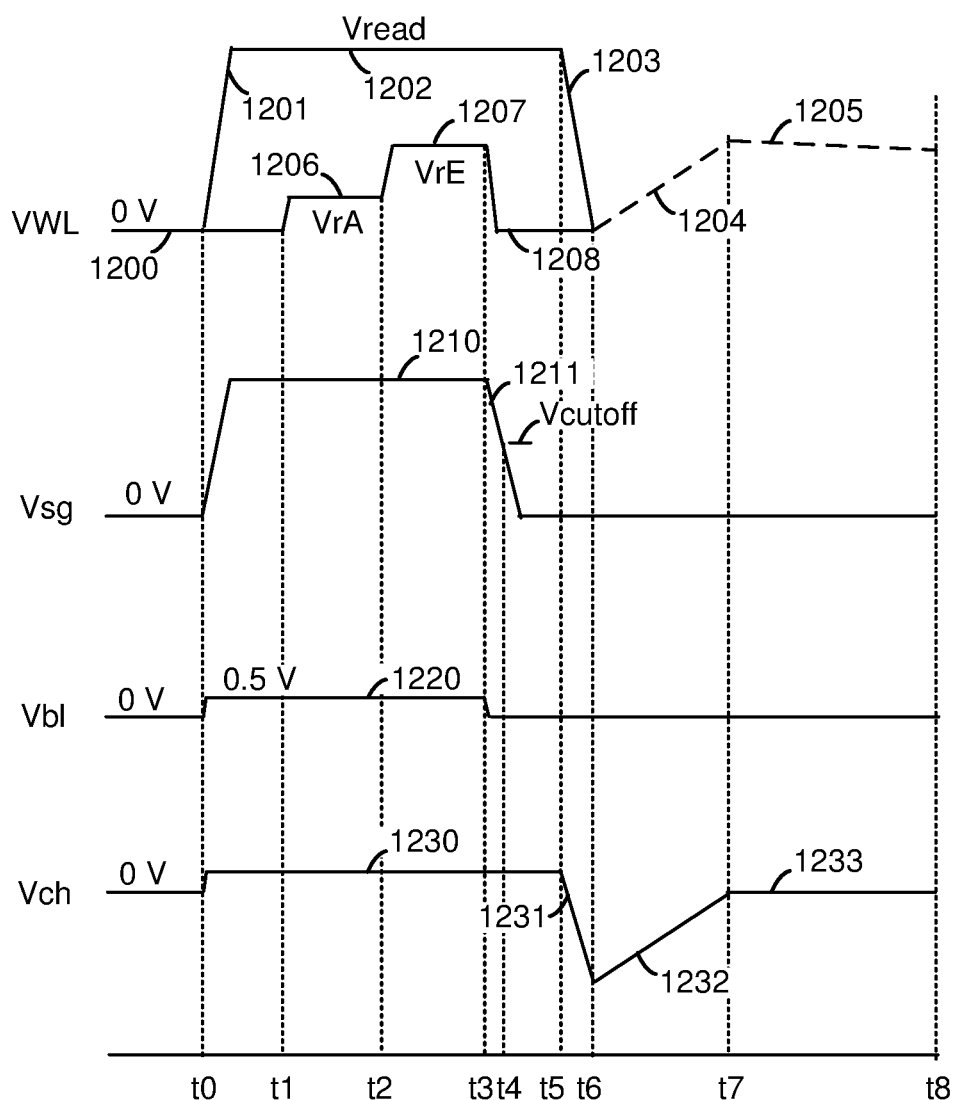
FIG. 12A depicts a first example of voltage signals in a read operation, consistent with FIG. 11A.

FIG. 12A depicts a first example of voltage signals in a read operation, consistent with FIG. 11A. In this example, the word line voltages are reset to 0 V (plot 1200) at the start of the read operation. VWL denotes the word line voltages. For the selected word line (the word line being read), the plots 1206 and 1207 denote read voltages of VrA and VrE, respectively. These voltages are used in a lower page read operation for memory cells storing three bits per cell. During each read voltage, a sensing operation occurs. Plot 1208 denotes the selected word line voltage returning to 0 V.

Plots 1201-1203 represent the voltage signal for unselected word lines. The voltage increases to Vread at t0 (plot 1201), is maintained at Vread until t5, then is decreased to 0 V at t5-t6 (plot 1203). This decrease in the word line voltages down couples the channel so that the channel voltage (Vch) decreases (plot 1231). From t6-t7, the channel voltage recovers back toward 0 V (plot 1232), causing a corresponding coupling up of the word line voltage (plot 1204). Subsequently, the word line voltage gradually decreases (plot 1205). For VWL, the solid line denotes a driven voltage and the dashed line denotes a floating voltage.

Plots 1210 and 1211 represent the voltage signal for the SGD and SGS select gate transistors. The voltage is increased to a peak level at t0 to provide the select gate transistors in a conductive state, maintained at the peak level until t3, then decreased to 0 V at t3-t4. When the Vsg decreases below a cutoff voltage, Vcutoff, at t4, the select gate transistors become non-conductive so that the channel voltage floats. The cutoff of the select gate transistors before the decrease of the unselected word line voltage at t5-t6 allows the channel voltage to be down coupled, as discussed. In another option, the select gate transistors are not cutoff before the decrease of the unselected word line voltage. In this case, the channel voltage begins to float when the unselected word line voltages fall below the Vth of the memory cells, cutting off the respective channel regions.

Plot 1220 represents the voltage signal for the bit lines. Vbl can be set at a small positive level such as 0.5 V during the read operation.

Plots 1230-1233 represent the channel voltage. Vch can be set at a similar level as Vbl, in one approach at t0-t5. As mentioned, Vch can decrease at t5-t6 due to voltage transitions on the unselected word lines and then recover at t6-t7.

Figure 12B:
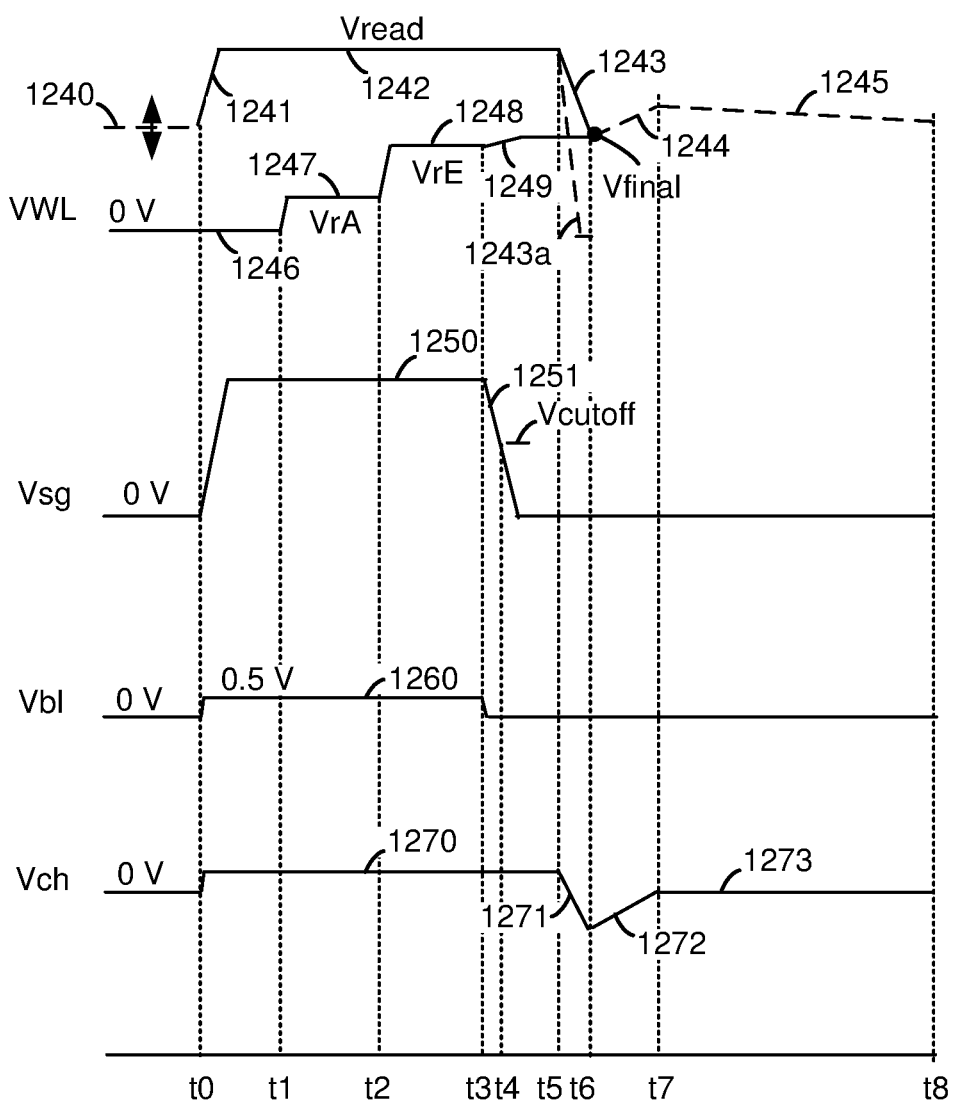
FIG. 12B depicts a second example of voltage signals in a read operation, consistent with FIG. 11A.

FIG. 12B depicts a second example of voltage signals in a read operation, consistent with FIG. 11A. In this example, the unselected word line voltages transition from a floating level (plot 1240) to Vread (plot 1242). For the selected word line, the voltage signal is initially at 0 V (plot 1246) and then at read voltages of VrA and VrE (plots 1247 and 1248, respectively). Plot 1249 denotes the selected word line voltage transitioning to a final voltage, Vfinal, at t6.

Plots 1241-1243 represent the voltage signal for unselected word lines. The voltage increases to Vread at t0 (plot 1241), is maintained at Vread until t5, then is decreased to Vfinal at t5-t6 (plot 1243). This decrease in the word line voltages down couples the channel so that the channel voltage (Vch) decreases at t5-t6 (plot 1271). However, the down coupling is less than in FIG. 12A. From t6-t7, the channel voltage recovers back toward 0 V (plot 1272), causing a corresponding coupling up of the word line voltage (plot 1244). Subsequently, the word line voltage gradually decreases (plot 1245).

As mentioned in connection with FIG. 3A, there can be a delay in changing the word line voltage based on a change in a voltage on the pre-switch control lines due to the capacitance of the word lines. For example, the plot 1243a can represent a change in the pre-switch control lines 325a and the plot 1243 can represent a corresponding change in the word line voltage. The voltage of the pre-switch control lines 325a is cutoff at t6 before the word line voltage has a chance to reach 0 V or other minimum level of the pre-switch control lines. Instead, the word line voltage reaches a final level of Vfinal>0 V.

Plots 1250 and 1251 represent the voltage signal for the SGD and SGS select gate transistors, similar to the corresponding voltage signal in FIG. 12A.

Plot 1260 represents the voltage signal for the bit lines, similar to the corresponding voltage signal in FIG. 12A.

Plot 1270-1273 represent the channel voltage, similar to the corresponding voltage in FIG. 12A, but with a smaller down coupling.

FIG. 13 depicts examples of word line voltages during refresh operations for high, intermediate and low amplitude refresh voltages (plots 1300, 1310, and 1320, respectively). The short dashed lines denote floating voltages and the solid lines denote driven voltages. The long-dashed lines in the plots 1320 also denote driven voltages.

In the plots 1300, a plot 1301 represents an initial floating voltage of the word lines of a block. The refresh operation begins at t0, when the word line voltage is driven higher (plot 1302) to a high amplitude refresh voltage such as Vread, then maintained at Vread (plot 1303) until t2, then driven lower to a final level of, e.g., Vfinal from t2-t3 (plot 1304). As discussed in connection with FIG. 12B, the word line voltage may or may not reach the minimum level provided on the pre-switch control lines. The word line voltage is then allowed to float starting at t3, where it floats higher (plot 1305) and then begins to discharge (plot 1306). In this option, the group select signal is asserted from t0-t3.

A refresh operation with the high amplitude refresh voltage tends to increase the word line voltage, as depicted by comparing plots 1305 and 1306 to plot 1301. In particular, with a high amplitude refresh voltage, the voltage signal is typically driven lower before being floated. This results in some down coupling of the channel and subsequent up coupling of the channel and word line voltages. The up coupling is added to the word line voltage at the time the floating begins to provide the increasing voltage of plot 1305.

In the plots 1310, two examples are provided for the initial floating voltage of the word lines of a block. A plot 1313 represents a low initial floating voltage and a plot 1311 represents a high initial floating voltage. The refresh operation begins at t0, when the word line voltage is driven higher (plot 1314) or lower (plot 1312) to Vint, then maintained at Vint (plot 1315) until t3. The word line voltage is then allowed to float starting at t3, where it may float slightly higher and then discharge (plot 1316a) if the initial floating voltage is higher than Vint (plot 1311), or it may start discharging from Vint level (plot 1316b) if the initial floating voltage is lower than Vint (plot 1313). Vint can represent Vint1 or Vint2 from FIG. 11B, for example. In this option, the group select signal is asserted from t0-t3.

A refresh operation with the intermediate amplitude refresh voltage tends to increase the word line voltage if the word line voltage is relatively low, as depicted by comparing plot 1316b to plot 1313, or decrease the word line voltage if the word line voltage is relatively high, as depicted by comparing plot 1316a to plot 1311.

With an intermediate amplitude refresh voltage, the voltage signal may be driven lower before being floated, as with plot 1312, so there is some down coupling of the channel and subsequent up coupling of the channel and word line voltages. The up coupling is added to the word line voltage at the time the floating begins to provide the slightly increasing voltage after t3 for plot 1316a. If the voltage signal is not driven lower before being floated, as with plot 1314, there is no down coupling of the channel and subsequent up coupling of the channel and word line voltages.

In the plots 1320, a plot 1321 represents an initial floating voltage of the word lines. The refresh operation begins at t0, when the word line voltage is driven lower (plot 1322) to a low amplitude refresh voltage such as Vss, then maintained at Vss (plot 1323) until t3, in one option. The word line voltage is then allowed to float starting at t3, where it may float slightly higher and then discharge (plot 1324). In this option, the group select signal is asserted from t0-t3.

In another option, the word line voltage is maintained at Vss also from t2-t4 (plot 1325). The word line voltage is then allowed to float starting at t4, where it may float slightly higher and then discharge (plot 1326). However, the floating level of plot 1326 is lower than the level of plot 1324, which is advantageous for reducing DRD errors for SLC cells, for example. Maintaining the word line voltage at Vss for a longer period of time helps lower the floating word line voltage when the group select signal de-asserted. In this example, the word line voltage is driven at Vss from t0-t4, which is longer than the period from t0-t3 in which the word line is driven in the plots 1300 and 1310, for example. In this option, the group select signal is asserted from t0-t4.

This is an example of how a refresh voltage signal for a groups of blocks can have a duration which is tailored to the number of bits per cell of the group. This is in addition to tailoring the amplitude of the refresh voltage signal.

A refresh operation with a low amplitude refresh voltage tends to decrease the word line voltage, as depicted by comparing plot 1324 to plot 1321.

With a low amplitude refresh voltage, the voltage signal is typically driven lower before being floated, as with plot 1322, so there is some down coupling of the channel and subsequent up coupling of the channel and word line voltages. The up coupling is added to the word line voltage at the time the floating begins to provide the increasing voltage after t3. In an example implementation, the plots 1323 and 1325 represent a first voltage signal which is maintained at a first voltage (Vss) for a first period of time (t1-t4)), and the plot 1303 represents a second voltage signal which is maintained at a second voltage (Vread), greater than the first voltage, for a second period of time (t1-t2), shorter than the first period of time.

The plots 1323 and 1325 also represent a first voltage signal which is maintained at no more than 0 V for a respective period of time (t1-t4), and the plot 1303 represents a second voltage signal which is maintained at greater than 0 V for a respective period of time (t1-t2).

The plots 1320 represent a first voltage signal which transitions from an initial voltage (plot 1321) to a respective lower voltage (0 V) and is maintained at the lower voltage until the first group of blocks are unselected (at t2 or t4) via a first group select line. The plots 1300 represent a second voltage signal which transitions from an initial voltage (plot 1301) to a higher voltage (Vread), is maintained at the higher voltage (at t1-t2) and then transitions to a respective lower voltage (Vfinal). The first group of blocks can store n bits per cell and the second group of blocks can store m bits per cell. A second group of blocks are unselected (at t3) via a second group select line when the second voltage signal is at the respective lower voltage.

The plots 1320 can be an example of a first refresh voltage signal which is applied to word lines connected to memory cells of a first group of blocks, e.g., SLC blocks, and the plots 1300 can be an example of a second refresh voltage signal which is applied, concurrently with the applying of the first refresh voltage signal, to the word lines connected to the memory cells of a second group of blocks, e.g., MLC blocks.

In an example implementation, the first refresh voltage signal is maintained at a first voltage, e.g., 0 V, and the second refresh voltage signal is maintained at a second voltage, e.g., Vread, higher than the first voltage.

FIG. 14A-14C depicts example time periods TP1-TP3 between successive refresh operations. A voltage signal for a refresh operation is denoted by Rf and a voltage signal for a read operation is denoted by Rd.

Generally, the refresh operations can be performed at fixed intervals, as long as a read operation is not in progress. If a read operation is in progress, a wait can be implemented before performing the refresh operation, where the wait is less than the usual period between refresh operations. In this example, first-fourth refresh operations are performed at t1-t2, t3-t4, t7-t8 and t11-t12. The time period between the first and second refresh operations, TP1, is equal to the time period TP2 between the second and third refresh operations. However, the time period between the third and fourth refresh operations, TP3, is greater than TP1 and TP2 due to a wait caused by the refresh operation at t9-t10.

Read operations are performed at t5-t6 and t9-t10.

The solid line plots denote driven voltages and the dashed line plots denote floating voltages.

FIG. 14A depicts an example of word line voltages during read operations and refresh operations with a high amplitude refresh voltage, Vread. The high amplitude refresh voltages of the refresh operations are represented by the plots 1400, 1401, 1403 and 1405. Since a high amplitude refresh voltage is used, each refresh operation increases the word line voltage. The voltage of Vread for unselected word lines during the read operations are represented by the plots 1402 and 1404.

FIG. 14B depicts an example of word line voltages during read operations and refresh operations with an intermediate amplitude refresh voltage, Vint. The intermediate amplitude refresh voltages of the refresh operations are represented by the plots 1410, 1411, 1413 and 1415. Since an intermediate amplitude refresh voltage is used, each refresh operation can increase or decrease the word line voltage. For example, the refresh voltages of plots 1410, 1413 and 1415 decrease the word line voltage and the refresh voltage of plot 1411 increases the word line voltage. The voltage of Vread in the read operations is represented by the plots 1412 and 1414.

FIG. 14C depicts an example of word line voltages during read operations and refresh operations with a low amplitude refresh voltage, Vss. The low amplitude refresh voltages of the refresh operations are represented by the plots 1420, 1421, 1423 and 1425. Since a low amplitude refresh voltage is used, each refresh operation decreases the word line voltage. Signals at Vread are is represented by the plots 1422 and 1424.

FIG. 15 depicts an example of a selected block BLK0 and an unselected block BLK1 in a group of blocks GRP0, consistent with FIG. 3A. BLK0 includes a set of memory cells 1500-1503, and a set of word lines 1505 is connected to the set of memory cells. BLK1 includes a set of memory cells 1510-1513, and a set of word lines 1515 is connected to the set of memory cells. In one scenario, a read operation is performed on the selected block while a refresh operation is performed on the unselected block.

Accordingly, it can be seen that, in one implementation, an apparatus comprises: a first group of blocks of memory cells reserved for storing n bits per cell, the first group of blocks are selectable concurrently by a first group select line; a set of word lines connected to the memory cells of each block of the first group of blocks; a set of row decoders for the first group of blocks comprising a row decoder for a selected block of the first group of blocks and row decoders for unselected blocks of the first group of blocks, the row decoders for the unselected blocks of the first group of blocks are configured to apply a first voltage signal to word lines of the unselected blocks of the first group of blocks while the row decoder for the selected block of the first group of blocks applies a read voltage to a selected word line of the selected block of the first group of blocks in a respective read operation; a second group of blocks of memory cells reserved for storing m>n bits per cell, the second group of blocks are selectable concurrently by a second group select line; a set of word lines connected to the memory cells of each block of the second group of blocks; and a set of row decoders for the second group of blocks comprising a row decoder for a selected block of the second group of blocks and row decoders for unselected blocks of the second group of blocks, the row decoders for the unselected blocks of the second group of blocks are configured to apply a second voltage signal, different than the first voltage signal, to word lines of the unselected blocks of the second group of blocks while the row decoder for the selected block of the second group of blocks applies a read voltage to a selected word line of the selected block of the second group of blocks in a respective read operation.

In another implementation, a method comprises: performing a first voltage refresh operation for word lines of a first group of blocks of memory cells, the performing the first voltage refresh operation comprises connecting a first voltage signal from a voltage driver to a first set of pass transistors connected to the word lines of the first group of blocks, asserting a group select signal for the first set of pass transistors, the first voltage signal is tailored to refreshing floating voltages of the word lines of the first group of blocks when the memory cells of the first group of blocks store n bits per cell; and separately from the performing of the first voltage refresh operation, performing a second voltage refresh operation for word lines of a second group of blocks of memory cells, the performing the second voltage refresh operation comprises connecting a second voltage signal from the voltage driver to a second set of pass transistors connected to the word lines of the second group of blocks, asserting a group select signal for the second set of pass transistors, the second voltage signal is tailored to refreshing floating voltages of the word lines of the second group of blocks when the memory cells of the second group of blocks store m>n bits per cell.

In another implementation, an apparatus comprises: a first group of blocks of memory cells reserved for storing n bits per cell, the first group of blocks are selectable concurrently by a first group select line; word lines connected to the memory cells of the first group of blocks; a second group of blocks of memory cells reserved for storing m>n bits per cell, the second group of blocks are selectable concurrently by a second group select line; word lines connected to the memory cells of the second group of blocks; and a control circuit. The control circuit is configured to concurrently apply a first refresh voltage signal to the word lines connected to the memory cells of the first group of blocks, and to concurrently apply a second refresh voltage signal to the word lines connected to the memory cells of the second group of blocks.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a first group of blocks of memory cells reserved for storing n bits per cell, the first group of blocks are selectable concurrently by a first group select line;

a set of word lines connected to the memory cells of each block of the first group of blocks;

a set of row decoders for the first group of blocks comprising a row decoder for a selected block of the first group of blocks and row decoders for unselected blocks of the first group of blocks, the row decoders for the unselected blocks of the first group of blocks are configured to apply a first voltage signal to word lines of the unselected blocks of the first group of blocks while the row decoder for the selected block of the first group of blocks applies a read voltage to a selected word line of the selected block of the first group of blocks in a respective read operation;

a second group of blocks of memory cells reserved for storing m>n bits per cell, the second group of blocks are selectable concurrently by a second group select line;

a set of word lines connected to the memory cells of each block of the second group of blocks; and a set of row decoders for the second group of blocks comprising a row decoder for a selected block of the second group of blocks and row decoders for unselected blocks of the second group of blocks, the row decoders for the unselected blocks of the second group of blocks are configured to apply a second voltage signal, different than the first voltage signal, to word lines of the unselected blocks of the second group of blocks while the row decoder for the selected block of the second group of blocks applies a read voltage to a selected word line of the selected block of the second group of blocks in a respective read operation.

2. The apparatus of claim 1, wherein:
the first voltage signal is configured to reduce floating voltages of the word lines of the unselected blocks of the first group of blocks; and
the second voltage signal is configured to increase floating voltages of the word lines of the unselected blocks of the second group of blocks.

3. The apparatus of claim 1, wherein:
the first voltage signal is maintained at a first voltage for a first period of time; and
the second voltage signal is maintained at a second voltage, greater than the first voltage, for a second period of time, shorter than the first period of time.

4. The apparatus of claim 1, wherein:
the first voltage signal is maintained at no more than 0 V for a respective period of time; and
the second voltage signal is maintained at greater than 0 V for a respective period of time.

5. The apparatus of claim 1, wherein:
the first voltage signal transitions from an initial voltage to a respective lower voltage and is maintained at the lower voltage until the first group of blocks are unselected via the first group select line;
the second voltage signal transitions from an initial voltage to a higher voltage, is maintained at the higher voltage and then transitions to a respective lower voltage; and
the second group of blocks are unselected via the second group select line when the second voltage signal is at the respective lower voltage.

6. The apparatus of claim 5, wherein:
voltages of the word lines of the selected block and the unselected blocks of the first group of blocks begin floating when the first group of blocks are unselected; and voltages of the word lines of the selected block and the unselected blocks of the second group of blocks begin floating when the second group of blocks are unselected.

7. The apparatus of claim 1, wherein:
each word line of the respective sets of word lines of the first group of blocks is connected to a respective pass transistor;
each pass transistor of the first group of blocks has a control gate connected to the first group select line;
each word line of the respective sets of word lines of the second group of blocks is connected to a respective pass transistor; and
each pass transistor of the second group of blocks has a control gate connected to the second group select line.

8. The apparatus of claim 1, wherein:
after the respective read operation for the selected word line of the selected block of the first group of blocks, the set of row decoders for the first group of blocks are configured to periodically and concurrently apply the first voltage signal to the word lines of each block of the first group of blocks; and
after the respective read operation for the selected word line of the selected block of the second group of blocks, the set of row decoders for the second group of blocks are configured to periodically and concurrently apply the second voltage signal to the word lines of each block of the second group of blocks.

9. The apparatus of claim 1, wherein:
a voltage driver connected to the set of row decoders for the first group of blocks and to the set of row decoders for the second group of blocks, the voltage driver is configured to output the first voltage signal to the row decoders for the unselected blocks of the first group of blocks during the respective read operation of the selected word line of the selected block of the first group of blocks, and to output the second voltage signal to the row decoders for the unselected blocks of the second group of blocks during the respective read operation of the selected word line of the selected block of the second group of blocks.

10. A method, comprising:
performing a first voltage refresh operation for word lines of a first group of blocks of memory cells, the performing the first voltage refresh operation comprises connecting a first voltage signal from a voltage driver to a first set of pass transistors connected to the word lines of the first group of blocks, and asserting a group select signal for the first set of pass transistors, the first voltage signal is tailored to refreshing floating voltages of the word lines of the first group of blocks when the memory cells of the first group of blocks store n bits per cell; and separately from the performing of the first voltage refresh operation, performing a second voltage refresh operation for word lines of a second group of blocks of memory cells, the performing the second voltage refresh operation comprises connecting a second voltage signal from the voltage driver to a second set of pass transistors connected to the word lines of the second group of blocks, and asserting a group select signal for the second set of pass transistors, the second voltage signal is tailored to refreshing floating voltages of the word lines of the second group of blocks when the memory cells of the second group of blocks store m>n bits per cell.

11. The method of claim 10, wherein:
the first voltage signal is tailored to reduce the floating voltages of the word lines of the first group of blocks; and
the second voltage signal is tailored to increase the floating voltages of the word lines of the second group of blocks.

12. The method of claim 10, wherein:
a duration of the first voltage signal is longer than a duration of the second voltage signal.

13. The method of claim 10, wherein:
the memory cells of the second group of blocks are arranged in NAND strings comprising respective channels; and
the second voltage signal is configured to increase floating voltages of the word lines of the second group of blocks through up coupling from the channels.

14. The method of claim 10, wherein:
the first voltage signal is tailored based on program-erase cycles of the first group of blocks and the n bits per cell; and
the second voltage signal is tailored based on program-erase cycles of the second group of blocks and the m bits per cell.

15. The method of claim 10, wherein:
the first voltage signal is maintained at a first voltage for a first period of time; and
the second voltage signal is maintained at a second voltage, greater than the first voltage, for a second period of time, shorter than the first period of time.

16. An apparatus, comprising:
a first group of blocks of memory cells reserved for storing n bits per cell, the first group of blocks are selectable concurrently by a first group select line;
word lines connected to the memory cells of the first group of blocks;
a second group of blocks of memory cells reserved for storing m>n bits per cell, the second group of blocks are selectable concurrently by a second group select line;
word lines connected to the memory cells of the second group of blocks; and
a control circuit, the control circuit is configured to concurrently apply a first refresh voltage signal to the word lines connected to the memory cells of the first group of blocks, and to concurrently apply a second refresh voltage signal to the word lines connected to the memory cells of the second group of blocks, the first refresh voltage signal is configured to reduce floating voltages of the word lines of the first group of blocks, and the second voltage signal is configured to increase floating voltages of the word lines of the second group of blocks.

17. The apparatus of claim 16, further comprising:
a first set of pass transistors connected to the word lines of the first group of blocks, each pass transistor of the first set of pass transistors has a control gate connected to the first group select line; and
a second set of pass transistors connected to the word lines of the second group of blocks, each pass transistor of the second set of pass transistors has a control gate connected to the second group select line.

18. The apparatus of claim 17, further comprising:
a first set of row decoders connected to the first set of pass transistors;
a second set of row decoders connected to the second set of pass transistors; and
a voltage driver connected to the first set of row decoders and to the second set of row decoders, the voltage driver is configured to output the first refresh voltage signal to the first set of row decoders and to output the second refresh voltage signal to the second set of row decoders.

19. The apparatus of claim 16, wherein:
the first refresh voltage signal is maintained at a first voltage; and
the second refresh voltage signal is maintained at a second voltage, higher than the first voltage.

* * * * *